(12) United States Patent
Murakami et al.

(10) Patent No.: US 7,391,055 B1
(45) Date of Patent: Jun. 24, 2008

(54) CAPACITOR, SEMICONDUCTOR DEVICE AND MANUFACTURING METHOD THEREOF

(75) Inventors: Satoshi Murakami, Kanagawa (JP); Yoshiharu Hirakata, Kanagawa (JP); Etsuko Fujimoto, Kanagawa (JP); Yu Yamazaki, Tokyo (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/570,223

(22) Filed: May 12, 2000

(30) Foreign Application Priority Data

May 14, 1999 (JP) ............................................. 11-134992

(51) Int. Cl.
*H01L 29/00* (2006.01)

(52) U.S. Cl. ............................... 257/72; 257/59; 257/347
(58) Field of Classification Search ..................... 257/59, 257/72, 347, 300–310
See application file for complete search history.

(56) References Cited

U.S. PATENT DOCUMENTS

| | | | |
|---|---|---|---|
| 4,555,746 A | * | 11/1985 | Mochizuki et al. |
| 4,775,225 A | | 10/1988 | Tsuboyama et al. |
| 4,874,461 A | | 10/1989 | Sato et al. |
| 4,899,137 A | | 2/1990 | Behrens et al. ............. 340/711 |
| 5,062,198 A | | 11/1991 | Sun |

(Continued)

FOREIGN PATENT DOCUMENTS

| EP | 0 604 006 | 6/1994 |
|---|---|---|

| EP | 0 978 877 A2 | 2/2000 |
|---|---|---|
| EP | 0 984 492 A2 | 3/2000 |
| EP | 1 006 664 A2 | 6/2000 |
| EP | 1 041 622 A1 | 10/2000 |

(Continued)

OTHER PUBLICATIONS

English Abstract of JP 11–095194.
Complete English translation of Japanese Patent Application No. JP 10–268316, published Oct .9, 1998.
U.S. Appl. No. 09/606,414, to Hirakata et al filed Jun. 29, 2000, including specification, claims, abstract, drawings, PTO filing receipt and amended claims.
JP 61–184518 full English translation.
JP 5–281558 full English translation.
JP 8–248427 full English translation.
JP 9–73093 full English translation.
JP 9–197413 full English translation.
JP 10–68955 full English translation.
European Search Report, Application No. EP 00 10 9971, search performed on Aug. 8, 2000, 4 pages.

(Continued)

*Primary Examiner*—Fetsum Abraham
*Assistant Examiner*—Kevin Quinto
(74) *Attorney, Agent, or Firm*—Cook, Alex, McFarron, Manzo, Cummings & Mehler, Ltd.

(57) ABSTRACT

A highly reliable capacitor, a semiconductor device having high operating performance and reliability, and a manufacturing method thereof are provided. A capacitor formed of a first conductive film 102, a dielectric 103 made of an insulating material, and a second conductive film 104 is characterized in that a pin hole 106 formed by chance in the dielectric 103 is filled up with an insulating material (filler) 107 made of a resin material. This can prevent short circuit between the first conductive film 102 and the second conductive film 104. The capacitor is used as a storage capacitor provided in a pixel of a semiconductor device.

46 Claims, 23 Drawing Sheets

U.S. PATENT DOCUMENTS

| | | | | |
|---|---|---|---|---|
| 5,308,998 | A | 5/1994 | Yamazaki et al. | |
| 5,337,171 | A | 8/1994 | Mase et al. | 359/53 |
| 5,379,139 | A | 1/1995 | Sato et al. | |
| 5,499,123 | A | 3/1996 | Mikoshiba | |
| 5,499,128 | A | 3/1996 | Hasegawa et al. | |
| 5,518,078 | A | 5/1996 | Tsujioka et al. | 178/18 |
| 5,605,846 | A | 2/1997 | Ohtani et al. | |
| 5,608,232 | A | 3/1997 | Yamazaki et al. | |
| 5,619,044 | A | 4/1997 | Makita et al. | |
| 5,637,515 | A | 6/1997 | Takemura | |
| 5,666,173 | A | 9/1997 | Mase et al. | 349/61 |
| 5,680,189 | A | 10/1997 | Shimizu et al. | |
| 5,691,793 | A | 11/1997 | Watanabe et al. | |
| 5,696,003 | A | 12/1997 | Makita et al. | |
| 5,739,882 | A | 4/1998 | Shimizu et al. | |
| 5,744,824 | A | 4/1998 | Kousai et al. | |
| 5,777,713 | A | 7/1998 | Kimura | |
| 5,814,835 | A | 9/1998 | Makita et al. | |
| 5,815,226 | A | 9/1998 | Yamazaki et al. | 349/111 |
| 5,821,562 | A | 10/1998 | Makita et al. | |
| 5,824,573 | A | 10/1998 | Zhang et al. | |
| 5,831,710 | A | 11/1998 | Colgan et al. | |
| 5,843,225 | A | 12/1998 | Takayama et al. | |
| 5,852,485 | A * | 12/1998 | Shimada et al. | |
| 5,879,977 | A | 3/1999 | Zhang et al. | |
| 5,915,174 | A | 6/1999 | Yamazaki et al. | |
| 5,922,125 | A | 7/1999 | Zhang | |
| 5,952,676 | A | 9/1999 | Sato et al. | |
| 5,962,871 | A | 10/1999 | Zhang et al. | |
| 5,978,061 | A | 11/1999 | Miyazaki et al. | |
| 5,978,063 | A | 11/1999 | Crawford et al. | |
| 5,982,471 | A | 11/1999 | Hirakata et al. | |
| 5,986,729 | A | 11/1999 | Yamanaka et al. | 349/79 |
| 6,013,929 | A * | 1/2000 | Ohtani | |
| 6,088,070 | A | 7/2000 | Ohtani et al. | |
| 6,104,461 | A | 8/2000 | Zhang et al. | 349/122 |
| 6,118,506 | A | 9/2000 | Yamazaki et al. | 349/111 |
| 6,151,092 | A | 11/2000 | Fujimura et al. | 349/156 |
| 6,160,269 | A | 12/2000 | Takemura et al. | |
| 6,162,667 | A | 12/2000 | Funai et al. | |
| 6,165,824 | A | 12/2000 | Takano et al. | |
| 6,225,645 | B1 | 5/2001 | Zhang | |
| 6,236,445 | B1 | 5/2001 | Foschaar et al. | |
| 6,238,754 | B1 | 5/2001 | Shohara et al. | |
| 6,275,061 | B1 | 8/2001 | Tomita | 324/770 |
| 6,285,042 | B1 | 9/2001 | Ohtani et al. | |
| 6,285,247 | B1 | 9/2001 | Shoji | |
| 6,288,766 | B1 | 9/2001 | Mashiko et al. | |
| 6,313,481 | B1 | 11/2001 | Ohtani et al. | 257/59 |
| 6,335,541 | B1 | 1/2002 | Ohtani et al. | |
| 6,356,330 | B1 | 3/2002 | Ando et al. | |
| 6,362,865 | B2 * | 3/2002 | Yoshida | 349/138 |
| 6,411,360 | B1 | 6/2002 | Matsuyama et al. | |
| 6,420,988 | B1 | 7/2002 | Azami et al. | 341/144 |
| 6,441,879 | B2 | 8/2002 | Hiraishi et al. | |
| 6,531,993 | B1 * | 3/2003 | Yamizaki et al. | |
| 6,555,420 | B1 | 4/2003 | Yamazaki | 438/158 |
| 6,576,926 | B1 | 6/2003 | Yamazaki et al. | 257/66 |
| 6,630,977 | B1 | 10/2003 | Yamazaki et al. | |
| 6,638,781 | B1 | 10/2003 | Hirakata et al. | 438/30 |
| 6,680,487 | B1 | 1/2004 | Kokubo et al. | 257/66 |
| 6,885,148 | B2 | 4/2005 | Yudasaka | |
| 6,909,115 | B2 | 6/2005 | Kokubo et al. | 257/66 |
| 7,002,659 | B1 | 2/2006 | Yamazaki et al. | |
| 2001/0051398 | A1 | 12/2001 | Hirakata et al. | |
| 2002/0013019 | A1 | 1/2002 | Ohtani et al. | 438/142 |
| 2002/0163457 | A1 | 11/2002 | Azami et al. | 341/150 |
| 2003/0057419 | A1 | 3/2003 | Murakami et al. | 257/72 |
| 2004/0084673 | A1 | 5/2004 | Hirakata et al. | 257/59 |
| 2005/0269569 | A1 | 12/2005 | Kokubo et al. | |

FOREIGN PATENT DOCUMENTS

| | | |
|---|---|---|
| JP | 61-184518 | 8/1986 |
| JP | 63-050817 | 3/1988 |
| JP | 5-281558 | 10/1993 |
| JP | 06-051319 | 2/1994 |
| JP | 06-059228 | 3/1994 |
| JP | 06-232059 A | 8/1994 |
| JP | 06-244104 | 9/1994 |
| JP | 06-265912 | 9/1994 |
| JP | 07-321339 A | 12/1995 |
| JP | 08-006053 | 1/1996 |
| JP | 08-008181 | 1/1996 |
| JP | 08-213317 | 8/1996 |
| JP | 8-248427 | 9/1996 |
| JP | 9-73093 | 3/1997 |
| JP | 09-162416 | 6/1997 |
| JP | 9-197413 | 7/1997 |
| JP | 10-68955 | 3/1998 |
| JP | 10-096955 | 4/1998 |
| JP | 10-206893 | 8/1998 |
| JP | 10-228022 | 8/1998 |
| JP | 10-247735 | 9/1998 |
| JP | 10-268316 | 10/1998 |
| JP | 10-268361 | 10/1998 |
| JP | 10-319440 | 12/1998 |
| JP | 10-325959 | 12/1998 |
| JP | 10-339889 | 12/1998 |
| JP | 11-084386 | 3/1999 |
| JP | 11-095194 | 4/1999 |
| JP | 11-095261 | 4/1999 |
| JP | 11-097702 | 4/1999 |
| JP | 11-133463 | 5/1999 |
| JP | 2000-122071 A * | 4/2000 |

OTHER PUBLICATIONS

U.S. Appl. No. 10/387,436, filed Mar. 14, 2003 with specification, drawings, claims and filing receipt.

European Search report re application No. 00110377.9, dated Nov. 25, 2004.

European Search report re application No. EP 00110377.9, dated Oct. 15, 2004.

Ohtani, H. et al, "Late–News Poster: A 60–in. HDTV Rear–Projector with Continuous–Grain–Silicon Technology," *Society for Information Display, International Symposium Digest of Technical Papers,* Anaheim California, May 17–22, 1998, *SID Digest,* vol. XXIX, pp. 467–470.

U.S. Appl. No. 09/606,414 (pending) to Hirakata et al. filed Jun. 26, 2000, including specification, abstract, claims, drawings and PTO filing receipt.

European Patent Office Search Report re application No. EP 00110377.9, dated Oct. 15, 2004.

\* cited by examiner

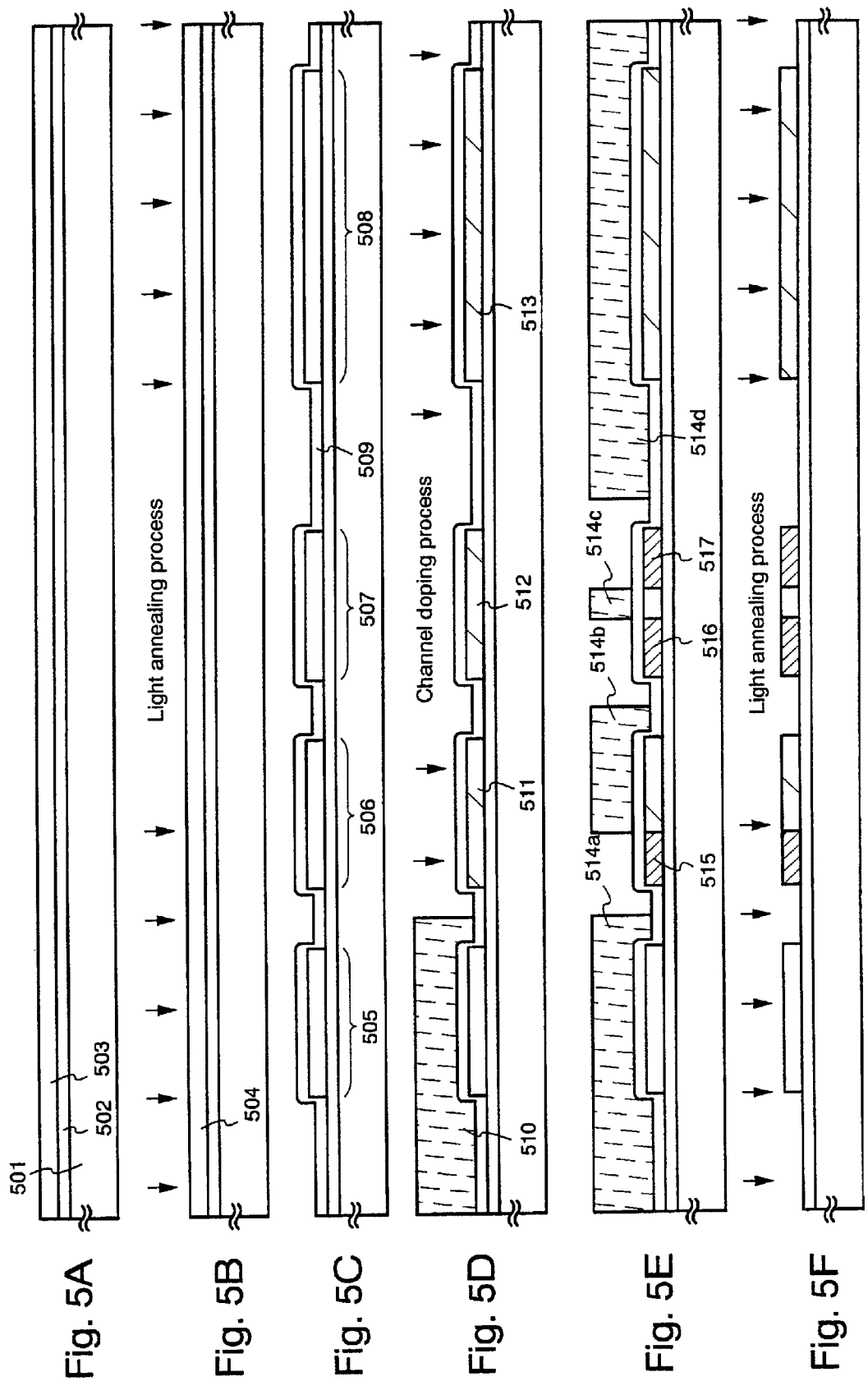

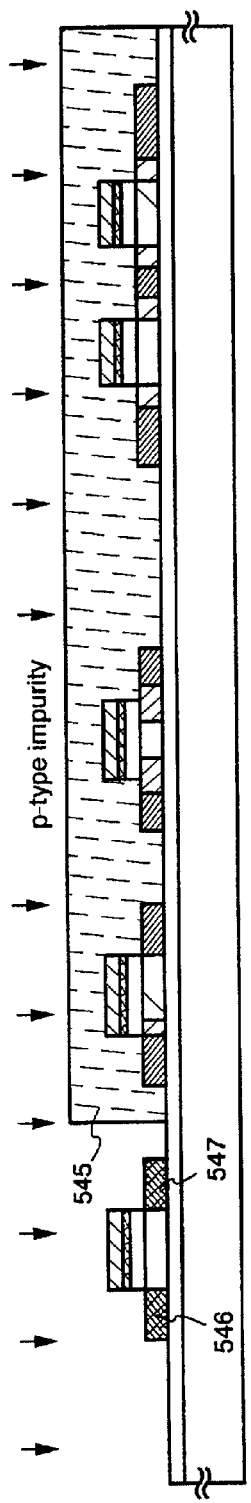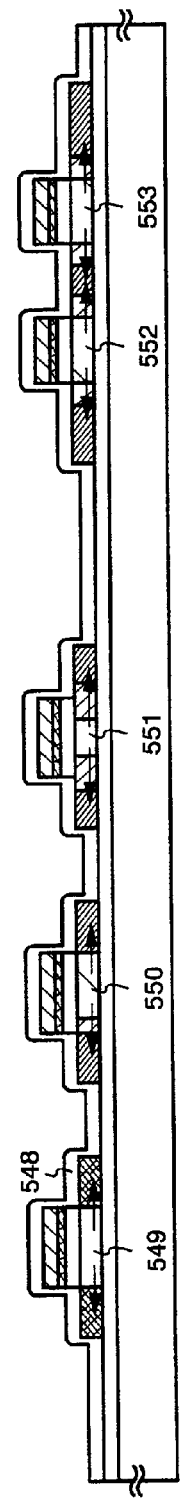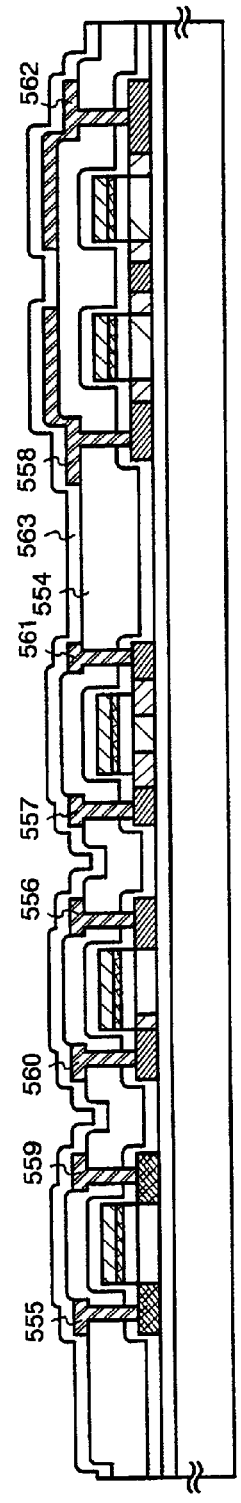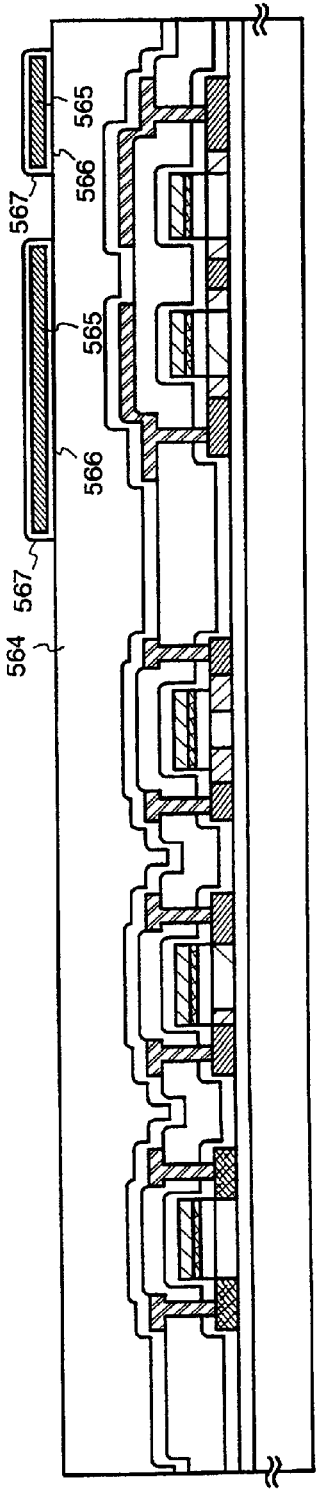

703: n-channel TFT

CAPACITOR, SEMICONDUCTOR DEVICE AND MANUFACTURING METHOD THEREOF

BACKGROUND OF THE INVENTION

1. Field of the Invention

The present invention relates to a semiconductor device having a circuit formed of a thin film transistor (hereinafter referred to as a TFT) on an insulator (substrate) having an insulating surface, and to a manufacturing method thereof. In particular, the present invention relates to an electro-optical device represented by a liquid crystal display device where a pixel portion and a driver circuit provided on the periphery thereof are provided on the same insulator, and to an electric apparatus (electronic device) having such an electro-optical device mounted thereon. It is to be noted that a semiconductor device as used herein means any device which functions by utilizing semiconductive characteristics, and the above-mentioned electro-optical device and electric apparatus having the electro-optical device mounted thereon are included in semiconductor devices.

2. Description of the Related Art

Development of semiconductor devices having a large-area integrated circuit formed of TFTs on a substrate having an insulating surface is making progress. Known typical examples of such semiconductor devices include liquid crystal display devices, EL (electroluminescence) display devices, and contact type image sensors. In particular, a TFT having a polysilicon film (polycrystalline silicon film) as an active layer (hereinafter referred to as a polysilicon TFT) has a high field-effect mobility, and thus, is used in circuits having various functions.

For example, in an active matrix liquid crystal display device, a pixel portion for displaying an image and a driver circuit based on a CMOS circuit and including a shift register, a level shifter, a buffer, a sampling circuit, and the like are formed on the same substrate. In a contact type image sensor, a driver circuit for controlling a pixel portion including a sample hold circuit, a shift register, a multiplexer, and the like is formed using TFTs.

In a pixel portion of an active matrix liquid crystal display device, a TFT (hereinafter referred to as a pixel TFT) is disposed in each of several tens to several million pixels, and each of the pixel TFTs is provided with a pixel electrode. An opposing electrode is provided on the side of an opposing substrate beyond liquid crystal, and a kind of capacitor with the liquid crystal being as a dielectric is formed. Voltage applied to the respective pixels is controlled by the switching function of the pixel TFTs to control the electric charge of the capacitors, thereby driving the liquid crystal, controlling the light transmission amount, and displaying an image.

However, since the stored capacitance of the capacitors gradually decreases due to leakage current caused by, for example, OFF current of the pixel TFTs (drain current which exists in spite of the OFF state of the TFTs), the light transmission amount varies to decrease the contrast in image display. Therefore, conventionally, capacitors (storage capacitors) for compensating for the capacitance lost by the capacitors with the liquid crystal being as a dielectric are additionally provided in parallel with the capacitors with the liquid crystal being as a dielectric.

As examples of such a storage capacitor provided in the pixel portion of an electro-optical device, the applicant of the present invention has already filed Japanese Patent Application Nos. Hei 11-045558, Hei 11-053424, and Hei 11-059455, which disclose a storage capacitor that is formed of a shielding film (or a light shielding film), an oxide formed on the shielding film, and a pixel electrode.

However, there is a fear that the storage capacitor disclosed in the above-mentioned applications may cause a problem, which is described in the following. With reference to FIG. 3, a shielding film 302 made of a metal film which blocks light is formed on an insulating film 301 made of a resin material, and an anodic oxide 303 formed by anodic oxidation and a pixel electrode 304 are formed on the shielding film 302 to form a storage capacitor. However, if there is dust or the like on the shielding film 302 when the anodic oxide 303 is formed, that portion may not be anodically oxidized to form a minute hole (hereinafter referred to as a pin hole) 305.

If the pixel electrode 304 is formed with the pin hole 305 existing, there is an inconvenience that the shielding film 302 and the pixel electrode 304 are short-circuited through the pin hole 305. In other words, a region which causes electric leakage or short circuit is formed between a pair of electrodes.

With reference to FIG. 4, a storage capacitor made of a shielding film 402, an anodic oxide 403, and a pixel electrode 404 is formed on an insulating film 401 made of a resin material. Reference numerals 405, 406, 407, and 408 denote an alignment film, an opposing substrate, an opposing electrode, and an alignment film, respectively. Liquid crystal 410 is retained between the alignment films 405 and 408 with the help of a spacer 409. The spacer 409 is provided for securing a cell gap in a liquid crystal cell.

Here, if the insulating film 401 made of a resin material is not flat enough, the top of the TFT 411 is higher than other regions. The storage capacitor is, since it is formed on the TFT 411, still higher, and thus, there is a step at the height H in the cell gap. If the spacer 409 is by chance disposed over the storage capacitor, the spacer is compressed in the process of stacking the liquid crystal cell, which may crush and break the storage capacitor. In particular, if the spacer is a bead-like spacer such as a silica ball, since such a spacer is very hard and force applied by such a spacer concentrates on a point, compression by such a spacer easily causes a crack in the pixel electrode.

Though the above-described inconvenience does not always occur, it can be a factor of decreasing the yield.

SUMMARY OF THE INVENTION

Accordingly, the present invention is made to solve the above problem, and an object of the invention is to further improve the inventions relating to the storage capacitor described in the above-mentioned applications, thereby improving the operating performance and the reliability of a semiconductor device. Another object of the invention is to provide a manufacturing method for materializing such a semiconductor device.

According to an aspect of the present invention, in order to solve the above problem, when the storage capacitor described in the above-mentioned applications is formed, an anodic oxide formed on a conductive film to be a lower electrode of the storage capacitor is covered with an insulating material for a time to fill up a pin hole formed in the anodic oxide with the insulating material.

This is illustrated in FIG. 1. In the figure, a first conductive film (more specifically, a shielding film) 102 is formed on an underlayer insulating film 101, and a storage capacitor 105 made of a dielectric (more specifically, an oxide of the shielding film) 103 and a second conductive film (more specifically, a pixel electrode) 104 is formed on the first conductive film 102. Here, a pin hole 106 formed in the anodic oxide 103 is filled up with a filler 107 made of an insulating material.

The filler 107 is preferably an insulating material (insulating film) made of a resin material. Such an insulating film made of a resin material can be formed by applying a solution. Such a solution coating type of an insulating film is particularly suitable for filling up a fine opening. Of course, a silicon oxide film formed by applying a solution or the like may also be used.

When an insulating film made of a resin material is used, it may be an optically polymerized insulating film, or may be a thermally polymerized insulating film. Further, it may have negative photosensitivity or positive photosensitivity, though it is preferable to use a resin material having negative photosensitivity in order to avoid photo degradation.

The short circuit of the storage capacitor due to the compression by the spacer described with reference to FIG. 4 can be avoided by using a spacer made of a resin material. A spacer made of a resin material is so elastic as to appropriately absorb pressure applied thereto, and, differently from the case of the bead-like spacer, since force is applied by an area of the spacer to the device, the pressure is dispersed, thereby preventing excessive pressure from concentrating on a point.

With reference to FIG. 2A, a pixel TFT 202, a leveling film (an interlayer insulating film) 203 for flattening the step formed when the pixel TFT 202 is formed, a shielding film 204, an oxide 205 obtained by oxidizing the shielding film 204, and a pixel electrode 206 are formed on a substrate 201. It is to be noted that a region where the shielding film 204 and the pixel electrode 206 overlap each other through the oxide 205 forms a storage capacitor.

Further, a spacer 207 made of a resin material is formed on the oxide 205 by patterning (photolithography). The spacer 207 is covered with an alignment film 208. Reference numerals 209, 210, and 211 denote an opposing substrate, an opposing electrode, and an alignment film on the opposing side, respectively. Liquid crystal 212 is retained between the alignment films 208 and 211.

The structure shown in FIG. 2A is characterized in that not only a spacer made of a resin material is used but also the resin material applied when the spacer is formed is enterprisingly used for filling up a pin hole in the oxide 205. The resin material once filled into the pin hole is thought to remain unremoved since etchant can not enter the pin hole in patterning for forming the spacer.

FIG. 2B is an enlarged view of a region surrounded by a dashed line 213 in FIG. 2A. Though not illustrated in FIG. 2A, actually, a pin hole 214 formed by chance in the oxide 205 is filled up with a filler 215 made of the resin material or is closed by the spacer 207. In other words, the oxide 205 has regions which are filled up with the insulating material made of the resin material.

As described in the above, according to the present invention, first, in order to prevent short circuit due to a pin hole formed accidentally in the dielectric of the storage capacitor, the pin hole is filled up with the insulating material to prevent defects due to formation of the storage capacitor. Further, by forming the spacer of the insulating film made of the resin material, the device is prevented from being broken due to pressure applied by the spacer over the storage capacitor.

Further, according to the present invention, it is also possible to fill up the pin hole formed in the dielectric of the storage capacitor simultaneously with the formation of the spacer made of the resin material. Therefore, without an additional process, defects with regard to the storage capacitor can be eliminated to improve the yield in the manufacturing process.

BRIEF DESCRIPTION OF THE DRAWINGS

In the accompanying drawings:

FIGS. 5A to 5F illustrate manufacturing steps of a pixel portion and a driver circuit;

FIGS. 7A to 7D illustrate manufacturing steps of the pixel portion and the driver circuit;

DETAILED DESCRIPTION OF THE PREFERRED EMBODIMENTS

Figure 1:
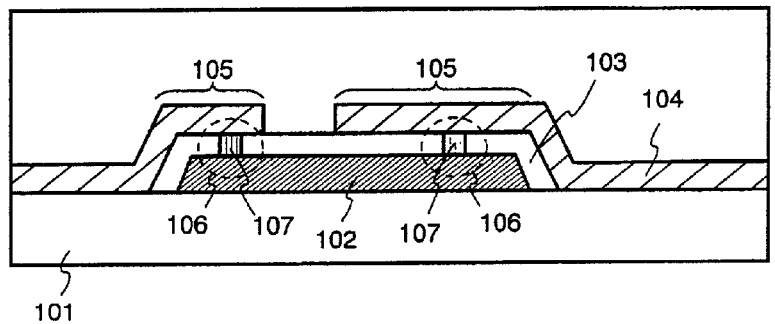
FIG. 1 illustrates the structure of a capacitor.

Preferred embodiments of the present invention are now described in detail.

Embodiment 1

An embodiment according to the present invention is described by using FIGS. 5A to 8B. A method for fabricating at the same time, TFTs for a pixel portion and a driver circuit provided in its peripheral, is described here. Note that a CMOS circuit which is a basic circuit for a shift register and buffer etc., and an n-channel TFT forming a sampling circuit (transfer gate) are shown for the driver circuit for the simplicity of explanation.

In FIG. 5A, it is preferable to use a glass substrate or a quartz substrate for substrate 501. Other than those, a silicon substrate, a metal substrate or a stainless steel substrate having an insulating film formed on the surface thereof may be used. If heat resistivity permits, it is also possible to use a plastic substrate.

A base film 502 which comprises an insulating film comprising silicon ("an insulating film comprising silicon" generically represents a silicon oxide film, a silicon nitride film and a silicon oxynitride film in the present Specification) is formed by plasma CVD or sputtering to a thickness of 100 to 400 nm on a surface of the substrate 501 on which the TFTs are to be fabricated.

Through the Specification silicon oxynitride is an insulating film represented by SiOxNy and denotes an insulating film which comprises silicon, oxygen and nitrogen at a prescribed proportion. In the present Embodiment a laminate film of a silicon oxynitride film of 100 nm thickness which contains nitrogen at 20 to 50 atomic % (typically 20 to 30 atomic %) and a silicon oxynitride film of 200 nm thickness which contains nitrogen at 1 to 20 atomic % (typically 5 to 10 atomic %) is used as the base film 502. Note that the thickness need not be limited to these values. The proportion of nitrogen and oxygen contained (atomic % proportion) in the silicon oxynitride film may be 3:1 to 1:3 (typically 1:1). Note that the silicon oxynitride film may be fabricated by using $SiH_4$, $N_2O$ and $NH_3$ as raw material gases.

The base film 502 is disposed in order to prevent impurity contamination from the substrate and may not be necessarily disposed in case of using a quartz substrate.

A semiconductor film containing amorphous structure (amorphous silicon film in the present embodiment (not shown)) is formed on the base film 502 at a thickness of 30 to 120 nm (preferably 50 to 70 nm) by a known film deposition method. As a semiconductor film containing amorphous structure, there are amorphous semiconductor film and microcrystalline semiconductor film. Further, a compound semiconductor film containing amorphous structure such as amorphous silicon germanium film etc. may also be included. When the film was formed into the above stated thickness, the thickness of the active layer at the point of finally completing the TFT becomes 10 to 100 nm (preferably 30 to 50 nm).

A semiconductor film containing crystalline structure (crystalline silicon film in embodiment 1) 503 is formed according to a technique disclosed in the Japanese Patent Application Laid-Open No. Hei 7-130652 (corresponding to U.S. Pat. No. 5,643,826). The technique described in the gazette is a crystallization means that uses a catalytic element for promoting crystallization (one or plural of element selected from nickel, cobalt, germanium, tin, lead, palladium, iron and copper; typically nickel) in crystallizing the amorphous silicon film.

More concretely, heat-treatment is conducted under the condition where the catalytic element(s) is held on the surface of the amorphous silicon film to convert the amorphous silicon film to the crystalline silicon film. Although Embodiment 1 uses a technique described in the Embodiment 1 of the gazette, a technique described in Embodiment 2 may also be used. Though single crystal silicon film and polycrystalline silicon film are both included in crystalline silicon film, the crystalline silicon film formed in the present embodiment is a silicon film having crystal grain boundaries. (FIG. 5A)

Though it depends on hydrogen content in the amorphous silicon film, it is preferable to carry out dehydrogenating process by heating at 400 to 550° C. for some hours to reduce the contained hydrogen amount at 5 atom % or lower and conduct crystallization process. The amorphous silicon film may be fabricated by other deposition methods such as sputtering or evaporation, but it is preferable to sufficiently reduce impurity elements such as oxygen or nitrogen contained in the film.

Because the base film and the amorphous silicon film can be fabricated by the same deposition method, they may be successively formed. It becomes possible to prevent contamination of the surface by not exposing to the atmosphere after formation of the base film, so that scattering in the characteristics of the fabricated TFTs can be reduced.

Next, a light generated from a laser light source (laser light) is irradiated onto the crystalline silicon film 503 (hereinafter referred to as laser annealing) and a crystalline silicon film 504 in which crystallinity is improved is formed. Though a pulse oscillation type or a continuous oscillation type excimer laser light is preferable for the laser light, a continuous oscillation type argon laser light or a Nd:YAG laser light may also be used as the laser light. The beam shape of the laser light may be linear, or it may be a rectangular shape. (FIG. 5B)

In place of laser light, a light generated from a lamp (lamp radiation) may be irradiated (hereinafter referred to as lamp annealing). As a lamp radiation, lamp radiation generated from for instance halogen lamp or infrared lamp can be used.

Note that a process for performing heat treatment (annealing) by laser light or lamp light as described here is referred to as a light annealing process. Because light annealing process can perform high temperature heat treatment in a short time, an effective heat treatment process can be performed at high throughput even in case of using a substrate that has a low heat resistance such as a glass substrate etc. Needless to say, they may be replaced by a furnace annealing using electric furnace (referred to as thermal annealing), and a combination of these may also be used since the object is annealing.

In embodiment 1, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 250 to 500 $mJ/cm^2$ (typically 350 to 400 $mJ/cm^2$).

Laser annealing process carried out at the above stated conditions has an effect of completely crystallizing the amorphous region remained after heat crystallization as well as reducing defects in the crystalline region already crystallized. Accordingly, the present process may be called a process for improving crystallinity of the semiconductor film, or a process for promoting crystallization of the semiconductor film. It is also possible to obtain such effect by optimizing the conditions of lamp annealing. In the present Specification such conditions is referred to as the first light annealing.

Island semiconductor films (hereinafter referred to as active layers) 505 to 508 are next formed by patterning the crystalline silicon film 504. Note that alignment markers used for adjusting the position in the later patterning are formed by using crystalline silicon film. In the present Embodiment time required for separately forming alignment markers (increase in the number of masks) can be saved because alignment markers can be formed at the same time with the formation of active layers.

Next a protection film 509 is formed over the active layers 505 to 508 for later impurity doping. The protection film 509 uses a silicon oxynitride film or a silicon oxide film of 100 to 200 nm (preferably 130 to 170 nm) thickness. This protection film 509 has a meaning of not exposing the crystalline silicon film directly to plasma in impurity doping, and enabling trace concentration control. (FIG. 5C)

Then, a resist mask 510 is formed thereon, and impurity element imparting p-type (hereinafter referred to as p-type impurity element) is doped through protection film 509. As a p-type impurity element, typically an element which belongs to group 13 of periodic table, more specifically, boron or gallium can be used. This process (referred to as channel doping process) is a process for controlling threshold voltage of a TFT. Here, boron is doped by ion doping in which diborane ($B_2H_6$) is excited by plasma without mass separation. Needless to say, it is acceptable to use ion implantation in which mass separation is not performed.

By this process, active layers 511 to 513 added with p-type impurity element (boron in this Embodiment) at a concentration of $1\times10^{15}$ to $1\times10^{18}$ atoms/cm$^3$ (typically $5\times10^{16}$ to $5\times10^{17}$ atoms/cm$^3$) are formed. These active layers 511 to 513 will later become active layers for n-channel TFTs. Note that the concentrations stated in the present Specification are measured values by SIMS (secondary ion mass spectroscopy).

Note that through the specification, an impurity region containing p-type impurity region at least in the above stated concentration range is defined as a p-type impurity region (b) (however, regions where impurity elements imparting n-type typically phosphorus or arsenic are doped at a concentration of $1\times10^{16}$ atoms/cm$^3$ are excluded). (FIG. 5D)

Resist mask 510 is next removed and new resist masks 514a to 514d are formed. Then impurity regions imparting n-type 515 to 517 are formed by doping impurity elements imparting n-type (hereinafter referred to as n-type impurity element). As an n-type impurity element, typically an element belonging to group 15, more specifically, phosphorus or arsenic can be used. (FIG. 5E)

These low concentration impurity regions 515 to 517 are impurity regions that function as LDD regions in the n-channel TFT of the later formed CMOS circuit and sampling circuit. In thus formed impurity regions, n-type impurity element is contained at a concentration of $2\times10^{16}$ to $5\times10^{19}$ atoms/cm$^3$ (typically $5\times10^{17}$ to $5\times10^{18}$ atoms/cm$^3$). In the present specification, an impurity region containing n-type impurity region in the above stated concentration range is defined as an n-type impurity region (b).

Note that phosphorus is doped here by ion doping to a concentration of $1\times10^{18}$ atoms/cm$^3$ in which phosphine ($PH_3$) is excited by plasma without mass separation. Needless to say, ion implantation in which mass separation is performed may be used as well. In this process, phosphorus is doped into the crystalline silicon film through protecting film 509.

Next, resist masks 514a to 514d and a protecting film 509 are removed, and irradiation process by laser light is conducted again. Here again excimer laser light of pulse oscillation type or continuous oscillation type is preferable as the laser light, but argon laser light of continuous oscillation type may also be used. The beam shape of the laser light may be either of linear or rectangular shape. However, because activation of the doped impurity element is the object, it is preferable to irradiate with an energy at a level of not melting the crystalline silicon film. It is also possible to conduct laser annealing process with the protecting film 509 left thereon. (FIG. 5F)

In embodiment 1, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 100 to 300 mJ/cm$^2$ (typically 150 to 250 mJ/cm$^2$).

The light annealing process carried out on the above stated conditions has an effect of recrystallizing the semiconductor film that was made into amorphous in impurity element doping as well as activating the impurity element imparting n-type or p-type that was doped. It is preferable that the above stated conditions make atomic arrangement coordinated without melting the semiconductor film and at the same time activate the impurity elements. The present process may be referred to as a process for activating the impurity element imparting n-type or p-type by light annealing, a process for recrystallizing the semiconductor film or a process for simultaneously carrying out both of them. Such effect can be obtained by optimizing the lamp annealing condition as well. In the present specification, this condition is referred to as the second light annealing. Note that it is possible to omit the second light annealing.

By this process, the boundary of n-type impurity regions (b) 515 to 517, that is, the junction area with the intrinsic regions (p-type impurity region (b) is also regarded as substantially intrinsic) that exist around n-type impurity region (b) become clear. This means that LDD region and channel forming region may form a very good junction when later finishing TFT.

On activation of the impurity elements by this laser light, activation by heat treatment which uses an electric furnace (furnace annealing) may also be combined, or the activation may be performed solely by furnace annealing. In case of conducting activation by heat treatment, heat treatment of approximately 450 to 650° C. (preferably 500 to 550° C.) may be conducted considering the heat resistance of the substrate.

Figure 6A:
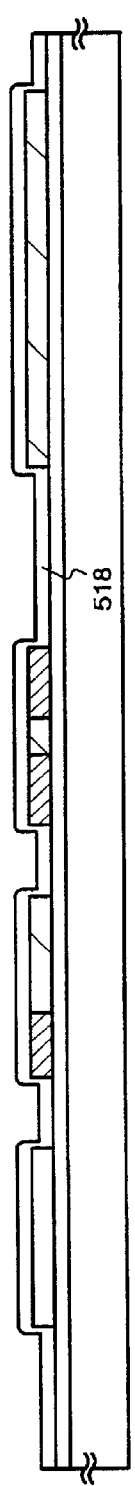
FIGS. 6A to 6F illustrate manufacturing steps of the pixel portion and the driver circuit.

Next, gate insulating film 518 is formed to cover the active layers 505 and 511 to 513. Gate insulating film 518 may be formed into a thickness of 10 to 200 nm, preferably into 50 to 150 nm. In the present embodiment, a silicon oxynitride film is formed into a thickness of 115 nm by plasma CVD with raw materials of $N_2O$ and $SiH_4$. (FIG. 6A)

Figure 6B:
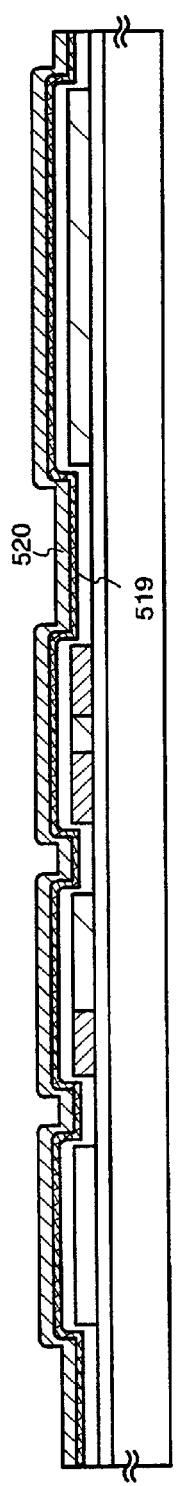

Then, a conductive film, that will form a gate wiring is formed. Note that the gate wiring may be formed by a single layered conductive film, but it is preferable to form laminated films of double layers, or triple layers as occasion demands. In the present embodiment, laminate comprising a first conductive film 519 and a second conductive film 520, is formed. (FIG. 6B)

As the first conductive film 519 and the second conductive film 520, a metal film comprising an element selected from tantalum (Ta), titanium (Ti), molybdenum (Mo), tungsten (W), chromium (Cr), niobium (N), and silicon (Si), a metal compound film composed of these element as its main component (typically tantalum nitride film, tungsten nitride film or titanium nitride film), an alloy film combining these elements (typically Mo—W alloy, Mo—Ta alloy, tungsten silicide film) or a laminate film of these thin films can be used.

The first conductive film 519 may be formed into 10 to 50 nm (preferably 20 to 30 nm) and the second conductive film 520 may be formed into 200 to 400 nm (preferably 250 to 350 nm). In embodiment 1, tantalum nitride (TaN) film of 50 nm thick was used as the first conductive film 519 and tantalum (Ta) film of 350 nm thick was used as the second conductive film 520.

Other than this, a laminate of tungsten nitride film and tungsten film, single layer of tantalum nitride film and a tungsten silicide film are also appropriate. In addition, when a structure which has a silicon film at a thickness of approximately 2 to 20 nm formed under the first conductive film 519 (polycide structure) is employed, close adhesion of conductive film formed on the silicon film is improved and oxidation of the conductive film can be prevented.

Further, it is effective to nitrificate by exposing the surface into plasma atmosphere using ammonia gas or nitrogen gas, in case of using a metal film for the second conductive film 520 like in embodiment 1. By doing so, it is possible to prevent the oxidation of the surface of the metal film.

Figure 6C:
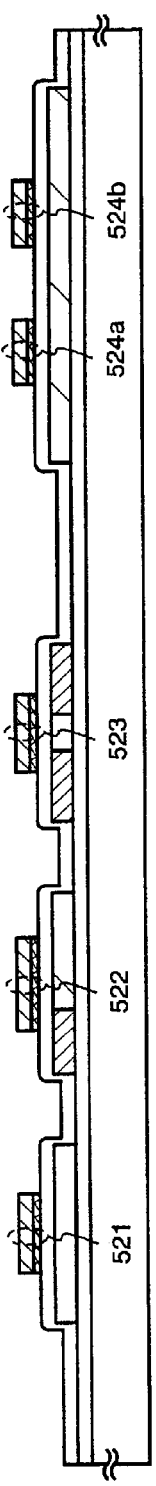

Gate wirings (they can also be referred to as gate electrodes) 521 to 524a and 524b are formed into 400 nm thickness by etching the first conductive film 519 and the second conductive film 520 at a time. Gate wirings 522 and 523 that are formed in a driver circuit are formed to overlap a portion of n-type impurity region (b) 515 to 517 by interposing a gate insulating film. Note that the gate wirings 524a and 524b seem to be two electrodes in the cross sectional view, but in effect they are formed of one continuing pattern. (FIG. 6C).

Figure 6D:
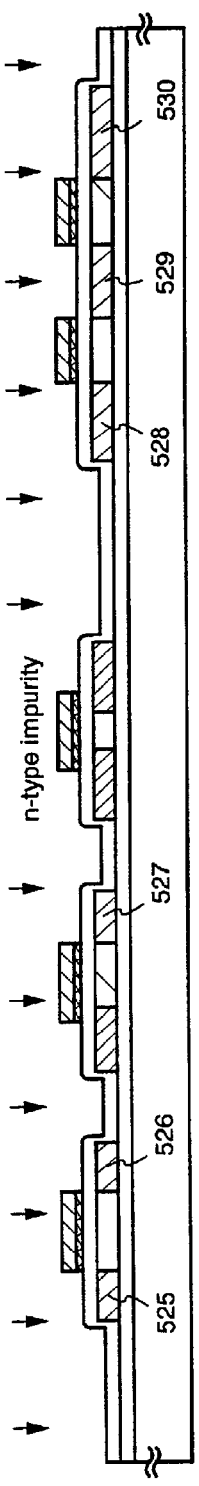

Then, n-type impurity element (phosphorus in embodiment 1) is doped in a self-aligned manner using gate electrodes 521 to 524b as masks. The concentration of phosphorus doped into thus formed impurity regions 525 to 530 are set at a concentration of ½ to ¹⁄₁₀ (specifically ⅓ to ¼) of the above stated n-type impurity region (b) (provided it is higher by 5 to 10 times than boron concentration added in the channel doping process, specifically $1\times10^{16}$ to $5\times10^{18}$ atoms/cm$^3$, typically $3\times10^{17}$ to $3\times10^{18}$). In the present Specification, an impurity region containing n-type impurity element at the above stated concentration range is defined as n-type impurity region (c). (FIG. 6D).

Note that although boron is already doped into n-type impurity regions (c) 527 to 530 at a concentration of $1\times10^{15}$ to $5\times10^{18}$ atoms/cm$^3$ in the channel doping process, because phosphorus is doped at a concentration of 5 to 10 times that of boron contained in the p-type impurity region (b), the effect of boron may be neglected.

Strictly speaking however, while concentration of phosphorus in portions of n-type impurity region (b) 515 to 517 that overlapped with gate wirings remains at $2\times10^{16}$ to $5\times10^{19}$ atoms/cm$^3$, portions that do not overlap with gate wirings are further added with phosphorus of $1\times10^{16}$ to $5\times10^{18}$ atoms/cm$^3$, and contain phosphorus at a slightly higher concentration.

Figure 6E:
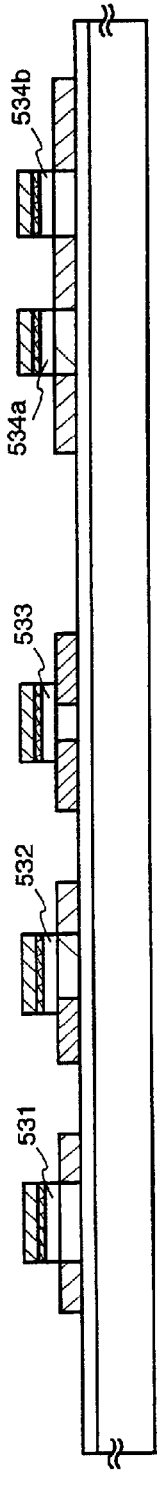

Next, the gate insulating film 518 is etched in a self-aligned manner with gate electrodes 521 to 524b as masks. Dry etching is used for the etching process and CHF$_3$ gas is used as an etchant. Note that the etchant need not be limited to this material. Thus, gate insulating films 531 to 534a and 534b under the gate wirings are formed. (FIG. 6E)

By exposing the active layers in this manner, acceleration voltage in the doping process of impurity elements next performed can be kept low. Accordingly throughput is increased since the necessary dose amount is small. Needless to say, the impurity regions may also be formed by through doping without etching the gate insulating film.

Figure 6F:
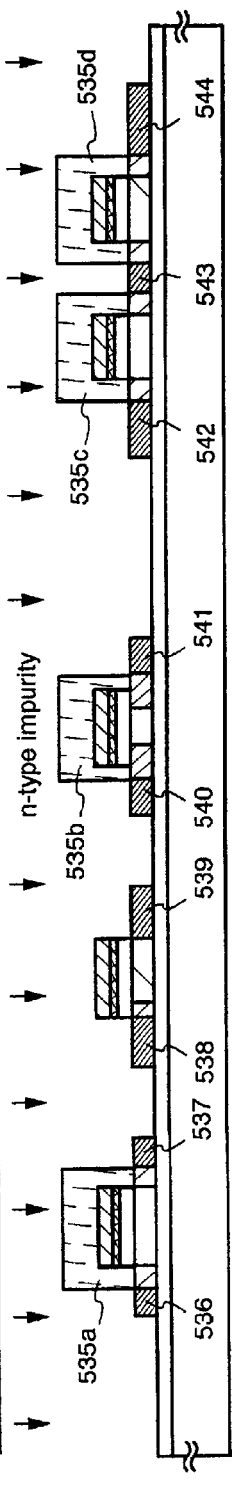

Resist masks 535a to 535d are next formed to cover the gate wirings, and impurity regions 536 to 544 containing phosphorus at a high concentration were formed by adding n-type impurity element (phosphorus in embodiment 1). Again ion doping (ion implantation is also acceptable) was conducted by utilizing phosphine (PH$_3$) and the phosphorus concentration in these regions is set at $1\times10^{20}$ to $1\times10^{21}$ atoms/cm$^3$ (specifically $2\times10^{20}$ to $5\times10^{20}$ atoms/cm$^3$). (FIG. 6F)

Note that in this Specification an impurity region containing n-type impurity element in the above stated concentration range is defined as n-type impurity region (a). Further, although phosphorus or boron, added in the preceding processes, are already contained in the impurity regions 536 to 544, influence of phosphorus or boron added in the preceding processes need not be considered since phosphorus is later added at a sufficiently high concentration. Therefore, it is acceptable to refer the impurity regions 536 to 544 to as n-type impurity region (a) in this Specification.

Resist masks 535a to 535d are then removed, and new resist mask 545 is formed. Then, p-type impurity element (boron in the present embodiment) is doped, and impurity regions 546 and 547 that include boron at a high concentration are formed. Here, boron is doped at a concentration of $3\times10^{20}$ to $3\times10^{21}$ atoms/cm$^3$ (typically $5\times10^{20}$ to $1\times10^{21}$ atoms/cm$^3$) by ion doping using diborane (B$_2$H$_6$). In the present specification, an impurity region that includes p-type impurity region in the above stated concentration range is defined as p-type impurity region (a). (FIG. 7A)

Phosphorus is already doped in a portion of impurity regions 546 and 547 (n-type impurity regions (a) 536 and 537 stated above) at a concentration of $1\times10^{20}$ to $1\times10^{21}$ atoms/cm$^3$. However boron is doped at a concentration higher by at least 3 times here. Therefore, already formed n-type impurity regions are totally inverted to p-type, and function as p-type impurity regions. Accordingly, it is acceptable to define impurity regions 546 and 547 as p-type impurity regions (a).

After removing resist mask 545, a first interlayer insulating film 548 is formed. As a first interlayer insulating film 548, an insulating film comprising silicon, concretely a silicon nitride film, a silicon oxide film, a silicon oxynitride film or a laminate film combining these may be formed. The film thickness may be 50 to 400 nm (preferably 100 to 200 nm).

In the present embodiment a 200 nm thick silicon oxynitride film (note that nitrogen concentration is 25 to 50 atomic %) is adopted, that is formed by plasma CVD from raw material gases of SiH$_4$, N$_2$O and NH$_3$. This first interlayer insulating film 548 has an effect of preventing increase of resistivity due to oxidation of gate wiring 521 to 524a and 524b in the next performed heat treatment process (activation process).

A heat treatment process is performed next in order to activate the impurity elements of n-type or p-type conductivity and which have been doped at their respective concentrations. Furnace annealing, laser annealing, rapid thermal annealing (ETA), or lamp annealing can be performed for this process. The activation process is performed by furnace annealing in embodiment 1. Heat treatment is performed in a nitrogen atmosphere at between 300 and 650° C., preferably from 400 to 550° C., here at 550° C. for 4 hours here. (FIG. 7B)

The catalytic element (nickel in embodiment 1) used in crystallization of an amorphous silicon film in embodiment 1 moved in the direction of the arrows and is captured in a region containing phosphorus at a high concentration (gettering) formed in the process of FIG. 6F. This is a phenomenon originated from gettering effect of a metal element by phosphorus. As a result, the concentration of nickel contained in later formed channel forming regions 549 to 553 is reduced below $1 \times 10^{17}$ atoms/cm$^3$. Note however because concentrations below $1 \times 10^{17}$ atoms/cm$^3$ is the detection limit of SIMS for nickel, it is impossible to measure with the present technology.

Conversely, the catalytic element precipitated at a high concentration in the regions which functioned as gettering sights of the catalytic element (regions where impurity regions 536 to 544 were formed in the process of FIG. 6F). The catalytic element existed in these regions at a concentration exceeding $5 \times 10^{18}$ atoms/cm$^3$ (typically $1 \times 10^{19}$ to $5 \times 10^{20}$ atoms/cm$^3$). However since it is acceptable if the regions that became the gettering sights function as a source region or a drain region, it is presumed that the existence of nickel do not cause any problem.

Further, a hydrogenation process is performed on the active layers by performing heat treatment in an atmosphere containing 3 to 100% hydrogen at 300 to 450° C. for 1 to 12 hours. This is a process to terminate dangling bonds in the semiconductor layers by thermally activated hydrogen. Plasma hydrogenation (using hydrogen activated by plasma) may be performed as another hydrogenation means.

The second interlayer insulating film 554 is next formed into 500 nm to 1.5 mm over the first interlayer insulating film 548. In embodiment 1 the second interlayer insulating film 554 is formed by silicon oxide film into 800 nm thickness by plasma CVD. Thus an interlayer insulating film of 1 mm thickness is formed from a laminate of the first interlayer insulating film (silicon oxynitride film) 548 and the second interlayer insulating film (silicon oxide film) 554.

Note that, it is possible to use organic resin films such as polyimide, acrylic, polyamide, polyimide amide, BCB (benzocyclobutene) for the second interlayer insulating film 554.

Contact holes are then formed in order to reach the source regions or the drain regions of the respective TFTs, and source wirings 555 to 558, and drain wirings 559 to 562 are formed. Note that, although not shown in the figures, the drain wirings 559 and 560 are formed from the same wiring in order to form a CMOS circuit. Note that, in embodiment 1 the electrodes are made with a three-layer structure laminate film of a 100 nm Ti film, a 300 nm aluminum film containing Ti, and a 150 nm Ti film formed successively by sputtering.

A silicon nitride film, a silicon oxide film, or a silicon oxynitride film is formed to a thickness of between 50 and 500 nm (typically 200 to 300 nm) next as a passivation film 563. (FIG. 7C)

It is effective to perform a plasma treatment using a gas that contains hydrogen such as H$_2$ and NH$_3$ preceding formation of the film and to perform heat treatment after the film formation. The preceding process provides excited hydrogen into the first and second interlayer insulating films. By performing a heat treatment to this state, the active layers are effectively hydrogenated because hydrogen added into the first and interlayer insulating films is diffused in the layer underneath, as well as improving the film quality of passivation film 563.

Further, after forming the passivation film 563, an additional hydrogenation process may be performed. For example, it is good to perform heat treatment for 1 to 12 hours at between 300 and 450° C. in an atmosphere including from 3 to 100% hydrogen. Or, a similar result can be obtained by using plasma hydrogenation.

Note that openings may be formed here in the passivation film 563 at positions where contact holes will be formed later in order to connect the pixel electrode and the drain wirings.

A third interlayer insulating film 564 comprising a resin (hereinafter referred to as resin insulating film) (in the present specification it is occasionally referred to as a leveling film) is formed next with an approximately 1 to 3 µm (typically 1.5 to 2 µm), as shown in FIG. 7D.

Polyimide, acrylic resin, polyamide, polyimide amide, BCB (benzocyclobutane), or Cyclotene, can be used as the resin material. The following points can be given as the benefits of using an organic resin film: superior levelness; and the parasitic capacitance can be reduced because the specific dielectric constant is low. Note that in addition to the above, other organic resin films, organic SiO compounds, etc. can be used. It is possible to use an insulating film comprising inorganic material if the superior in flatness.

Note that though an acrylic film which polymerizes by heat after application to the substrate is used here, one that polymerizes by light radiation may also be used. Needless to say, a photo sensitive material of positive type or negative type is also acceptable.

Further, it is possible to provide a resin insulating film colored by pigment etc. as a part of layer of the third interlayer insulating film 564 and use is as the color filter.

A shielding film 565 is formed next on the third interlayer insulating film (leveling film) 564 comprising resin material in the pixel portion. A term "shielding film" is used through the specification to a conductive film which has a characteristic of shielding light or electromagnetic wave.

Though various metal film can be used for the shielding film 565, a metal film which comprises an element chosen from among aluminum (Al), titanium (Ti), and tantalum (Ta) or a metal film with one of these as its principal constituent (in the present embodiment an element is regarded as the principal constituent when it is contained at over 50 weight %) are preferable, and the thickness may be between 100 and 300 nm. In embodiment 1 an aluminum film containing titanium at 1 wt % is formed into 125 nm thick. Note that in some cases this shielding film is referred to as "first conductive film" in the present specification.

Note that a silicon oxide film is formed to a thickness of 5 to 50 nm (typically 20 to 30 nm) prior to forming the shielding film 565. The shielding film 565 is then formed thereon and a silicon oxide film denoted as 565 is formed by performing etching treatment onto the above stated insulating film as the shielding film 565 as a mask.

Though the silicon oxide film 566 is disposed to increase adhesivensss of the third interlayer insulating film 564 and the shielding film 565, it is preferable to remove it from the region where the shielding film does not exist, because it will be a hindrance in forming a contact hole in the third interlayer insulating film. Note that the adhesiveness to the shielding film formed on this film can be increased by surface refinement also by performing plasma processing using CF$_4$ gas on the surface of the third interlayer insulating film 564.

Further, it is possible to form other connecting wirings, not only the shielding film, by using the aluminum film containing titanium. For example, a connecting wiring for connecting between circuits can be formed inside the driver circuit. However, in this case, before depositing the material that forms the shielding film or the connecting wiring, it is necessary to form contact holes, in advance, in the third interlayer insulating film.

Next, an oxide with a thickness from 20 to 100 nm (preferably between 30 and 50 nm) is formed on the surface of the shielding film 565 by publicly known anodic oxidation or plasma oxidation. (Anodic oxidation in the present embodiment) An aluminum oxide film (alumina film) is formed here as the anodic oxide film 567 because a film with aluminum as its principal constituent, is used as the shielding film 565 in embodiment 1. This anodic oxide film 567 will be a dielectric for the storage capacitor of the present embodiment.

Further, the structure used here has the insulating film being formed by anodic oxidation only on the surface of the shielding film, but other insulating film may also be formed by a gas phase method, such as plasma CVD, thermal CVD, or sputtering. In that case also, it is preferable to make the film thickness from 20 to 100 nm (more preferably between 30 and S0 nm).

Figure 8A:
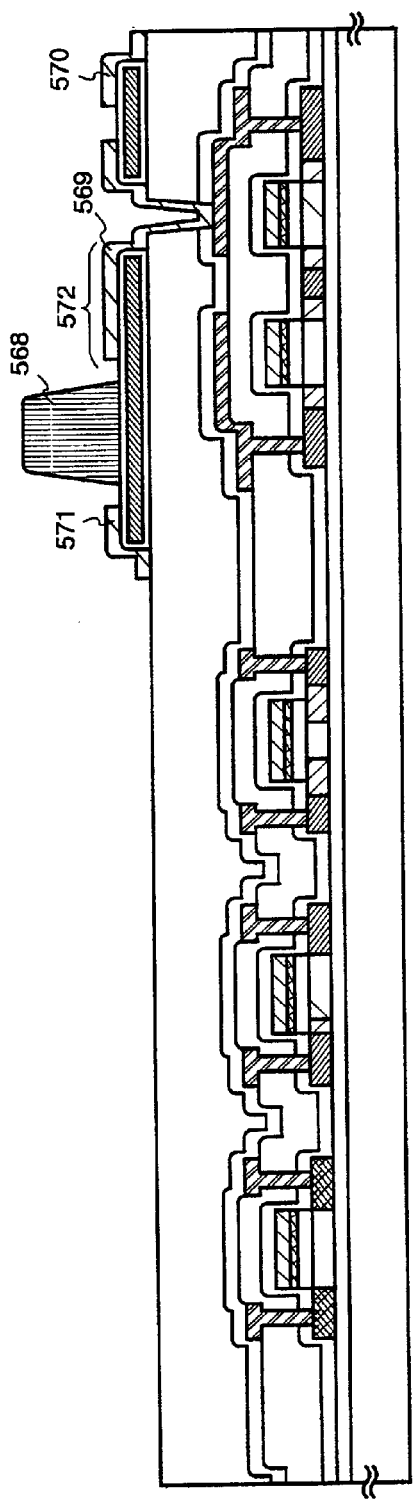
FIGS. 8A and 8B illustrate manufacturing steps of the pixel portion and the driver circuit.

A resin insulating film (negative type acrylic resin film in the present embodiment) of 4 mm thickness is formed as shown in FIG. 8A, and a spacer 568 is formed by performing patterning. At this time, even when a pin hole existed in the anodic oxide 567, it is covered by a resin insulating film of the same material with the spacer 568 in forming the spacer 568 as described by using FIGS. 2A and 2B.

Further, though the spacer 568 may be any shape, it is preferable in case of the present embodiment to form into a tapered shape. In case of the structure of the present embodiment, an alignment film is inevitably formed on the spacer 568 and a rubbing process is performed however there is a danger of causing a region where rubbing process is not properly performed behind the spacer when there is a steep step with the spacer 568. In order to avoid that, it is effective to form the spacer 568 to a tapered shape. For example, the angle of the taper may be set at 40 to 90° (preferably 50 to 70°).

Contact holes are formed next in the third interlayer insulating film 564 and in the passivation film 563 in order to reach the drain wiring 562, and the pixel electrode 569 is formed. Note that pixel electrodes 570 and 571 are each separate pixel electrodes for adjoining pixels. A transparent conductive film may be used for the pixel electrodes 569 to 571, in concrete, a compound film of indium oxide and tin oxide (referred to as ITO film) with a thickness of 110 nm is formed here by sputtering. Note that there are cases in which the pixel electrode is referred to as the "second conductive film" in the present specification.

Note that a metallic film such as an aluminum film or a silver film may be used as the material for the pixel electrode in case of forming a reflection type liquid crystal display device.

Further, a storage capacitor 572 is formed at this point where the pixel electrode 569 and the shielding film 565 overlap through the anodic oxide film 567. Note that though only the storage capacitor 572 is numbered, all regions where the shielding film and the pixel electrode overlaps functions as a storage capacitor.

In this case it is preferable to set the shielding film 565 at floating state (electrically isolated state) or a constant electric potential, more preferably at a common electric potential (median electric potential of image signals sent as data).

Thus, a substrate on which a driver circuit and a pixel portion are formed on the same substrate (hereinafter referred to as an active matrix substrate), is completed. Note that in FIG. 8B a p-channel TFT 701, and n-channel TFTs 702 and 703 are formed in the driver circuit, and that a pixel TFT 704 is formed from an n-channel TFT in the pixel portion are formed.

Note that the process order of embodiment 1 may be properly altered. Whatever the order may be, the basic function of the active matrix substrate does not differ as long as the structure of finally formed TFT is one shown in FIG. 8B, and the effect of the present invention is not impaired.

A channel forming region 601, a source region 602 and a drain region 603 are each formed by a p-type impurity region (a) in the p-channel TFT 701 of the driver circuit. Note that a region that contains phosphorus at a concentration of $1\times10^{20}$ to $1\times10^{21}$ atoms/cm$^3$ exists in a portion of a source region or a drain region in effect. Further in that region the catalytic element gettered in the process of FIG. 7B exists at a concentration exceeding $5\times10^{18}$ atoms/cm$^3$ (typically $1\times10^{19}$ to $5\times10^{20}$ atoms/cm$^3$).

Further, a channel forming region 604, a source region 605, and a drain region 606 are formed in the n-channel TFT 702, and a LDD region overlapping with the gate wiring by interposing a gate insulating film (such region is referred to as Lov region. 'ov' means overlap) 607 is formed in one side of the channel forming region (drain region side). Here, Lov region 607 contains phosphorus at a concentration of $2\times10^{16}$ to $5\times10^{19}$ atoms/cm$^3$, and is formed to completely overlap with the gate wiring.

A channel forming region 608, a source region 609, and a drain region 610 are formed in the n-channel TFT 703. LDD regions 611 and 612 are formed in both sides of the channel forming region. Note that the regions overlapping with the gate wiring by interposing an insulating film (Lov regions) and the regions that are not overlapped with the gate wiring (such region is referred to as Loff regions. 'off' means offset) are realized because a portion of the LDD regions 611 and 612 are placed so as to overlap with the gate wiring in this structure.

Figure 8B:
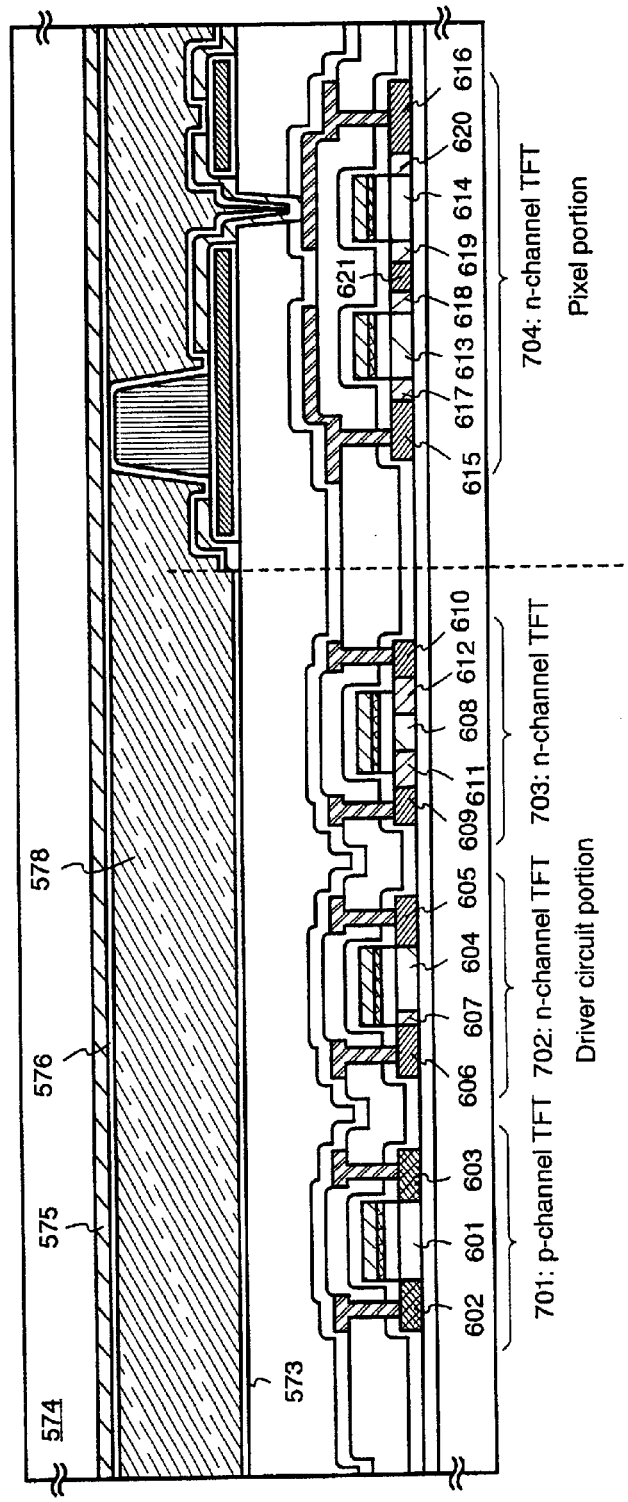
Figure 9:
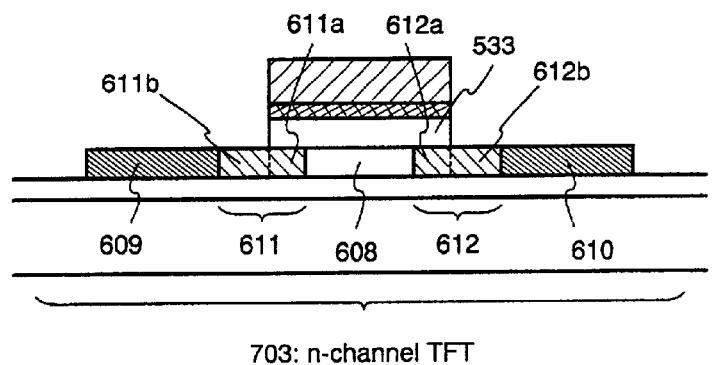
FIG. 9 illustrates the LDD structure of an n-channel TFT.

A cross sectional view shown in FIG. 9 is an enlarged diagram showing n-channel TFT 703 shown in FIG. 8B in the state of being manufactured to the process of FIG. 7B. As shown here, LDD region 611 is further classified into Lov region 611a and Loff region 611b, and LDD region 612 is further classified into Lov region 612a and Loff region 612b. Phosphorus is contained in the Lov regions 611a and 612a at a concentration of $2\times10^{16}$ to $5\times10^{19}$ atoms/cm$^3$, whereas it is contained at a concentration 1 to 2 times as much (typically 1.2 to 1.5 times) in the Loff regions 611b and 612b.

Further, channel forming regions 613 and 614, a source region 615, a drain region 616, Loff regions 617 to 620, and an n-type impurity region (a) 621 contacting the Loff regions 618 and 619 are formed in the pixel TFT 704. The source region 615, and the drain region 616 are each formed from n-type impurity region (a) here, and the Loff regions 617 to 620 are formed by n-type impurity region (c).

The structure of the TFTs forming each of the circuits of the pixel portion and the driver circuits can be optimized to correspond to the required circuit specifications, and the operation performance of the semiconductor device and its reliability can be increased in the present embodiment. Specifically, the LDD region placement in an n-channel TFT is made to differ depending upon the circuit specifications, and by using an Lov region or an Loff region properly, TFT structures with fast operating speeds and which place great importance on measures to counter hot carriers, and TFT structures that place great importance on low off current operation, can be realized on the same substrate.

For the case of an active matrix type liquid crystal display device, for example, the n-channel TFT 702 is suitable for driver circuits that place great importance on high speed, such as a shift register circuit, a signal divider circuit, a level shifter circuit, and a buffer circuit. In other words, by placing the Lov region in only one side (the drain region side) of the channel forming region, this becomes a structure that reduces the resistive constituents as much while placing great importance on hot carrier countermeasures. This is because, for the case of the above circuit group, the source region and the drain region functions do not change, and the carrier (electron) movement direction is constant. However, if necessary, Lov regions can be placed in both sides of the channel forming region.

Further, the n-channel TFT 703 is suitable for a sampling circuit (also referred to as a transfer gate) which places emphasis on both hot carrier countermeasures and low off current operation. In other words, hot carrier countermeasures can be realized by placement of the Lov region, and in addition, low off current operation is realized by placement of the Loff region. Furthermore, the functions of the source region and the drain region of a sampling circuit reverse, and the carrier movement direction changes by 180°; therefore a structure that has linear symmetry with the center of the gate wiring must be used. Note that it is possible to only form the Lov region, depending upon the circumstances.

Further, the n-channel TFT 704 is suitable for a pixel portion or a sampling circuit which place great importance on low off current operation. Namely, the Lov region, which is a cause of an increase in the off current value, is not employed, only the Loff region is used, allowing low off current operation to be realized. Furthermore, by utilizing an LDD region with a concentration lower than that of the driver circuit LDD region as the Loff region, although the on current value will fall a little, it is a thorough measure for lowering the off current value. Additionally, it has been confirmed that an n-type impurity region (a) 621 is extremely effective in lowering the off current value.

Further, the length (width) of the Lov region 607 of the n-channel TFT 702 may be between 0.1 and 3.0 μm, typically from 0.2 to 1.5 μm. Further, the length (width) of the Lov regions 611a and 612a of the n-channel TFT 703 may be from 0.1 to 3.0 μm, typically between 0.2 and 1.5 μm, and the length (width) of the Loff regions 611b and 612b may be from 1.0 to 3.5 μm, typically between 1.5 and 2.0 μm. Moreover, the length (width) of the Loff regions 617 to 620 formed in the pixel TFT 704 may be from 0.5 to 3.5 μm, typically between 2.0 and 2.5 μm.

Further the present embodiment enables to reduce the area for forming required capacitance by using an alumina film which has a high dielectric constant at 7 to 9 as a dielectric of the storage capacitance. Further, by using the shielding film formed on the pixel TFT as an electrode of the storage capacitance as in the present embodiment, an aperture ratio of the image display section of an active matrix liquid crystal display device can be increased.

Processes for fabricating an active matrix liquid crystal display device from an active matrix substrate is next described. Firstly an alignment film 573 is formed onto an active matrix substrate which has a structure shown in FIG. 8B. In the present embodiment a polyimide film is used as an alignment film. An opposing electrode 575 comprising a transparent conductive film and an alignment film 576 are formed on an opposing substrate 574. Note that a color filter or a shielding film may be formed onto the opposing substrate if necessary.

Next after forming an alignment film, rubbing treatment is performed so that liquid crystal molecules orient to have a preset pre-tilt angle. An active matrix substrate on which a pixel portion and a driver circuit are formed, and an opposing substrate are stuck together by a sealing material through a publicly known cell assembly process.

Thereafter a liquid crystal 578 is injected between the two substrates and completely sealed by a sealant (not shown in the figure). A publicly known liquid crystal material may be used for the liquid crystal. Thus an active matrix liquid crystal display device shown in FIG. 8B is complete.

It becomes possible to cover with an insulating substance, a pin hole which is accidentally formed in the dielectric of a storage capacitor by implementing the present invention, and a shortcoming such as generating a short circuit between the shielding film and the pixel electrode can be solved. Therefore, a throughput of the manufacturing process can be greatly improved.

It is difficult to detect pin holes themselves in filling out the pin holes in case of using a resin material as shown in the present embodiment however, a greater amount of resin material should exist in the positions where the pin holes existed compared to other regions. This fact indicates that a region that has a high carbon concentration exist partially in the dielectric of a storage capacitor. Publicly known analysis such as SIMS (secondary ion mass spectroscopy) or EDX (energy dispersion X-ray diffraction spectroscopy) may be used in analyzing the distribution of the carbon concentration in the dielectric substance.

Figure 4:
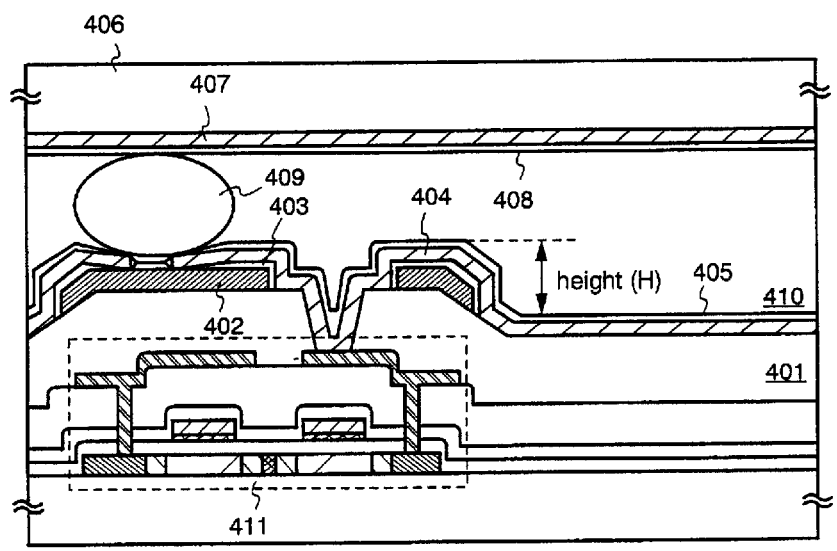
FIG. 4 illustrates the pixel structure of a liquid crystal display device before improvement according to the present invention.

Further, because a spacer which comprises a resin material superior in elasticity in the present embodiment, a pressure applied to a storage capacitor in pressing process described by using FIG. 4 can be absorbed (released). Moreover, because the spacer of the present embodiment has a larger contact area to the elements compared to that of a bead-shaped spacer, an excess pressure is not applied to a specific area.

Further, because the formation position can be freely designed, the image display region can be effectively utilized. They may be formed in the present embodiment, in regions which are not used as image display regions such as on the shielding film or on the source wiring. Needless to say, the spacers may be formed from not limited to resin material, but also from inorganic materials. It is also effective to form the spacers in tapered shape to make the contact area with the alignment film (or pixel electrode) larger, and scatter the pressure.

Embodiment 2

In the present embodiment, the structure of the active matrix liquid crystal display device in Embodiment 1 is described with reference to the perspective view of FIG. 10. An active matrix substrate is formed of a pixel portion 802, a driver circuit 803 on the gate side, and a driver circuit 804 on the source side formed on a glass substrate 801. A pixel TFT 805 in the pixel portion (which corresponds to the pixel TFT 704 shown in FIG. 8B) is an n-channel TFT, and is connected with a pixel electrode 806 and a storage capacitor 807 (which corresponds to the storage capacitor 572 shown in FIG. 8A).

The driver circuits provided on the periphery are formed based on a CMOS circuit. The driver circuit 803 on the gate side and the driver circuit 804 on the source side are connected with the pixel portion 802 through a gate wiring 808 and a source wiring 809, respectively. An external input/output terminal 811 connected with an FPC 810 is provided with input/output wirings (connecting wirings) 812 and 813 for transmitting signals to the driver circuits. Reference numeral 814 denotes an opposing substrate.

Figure 10:
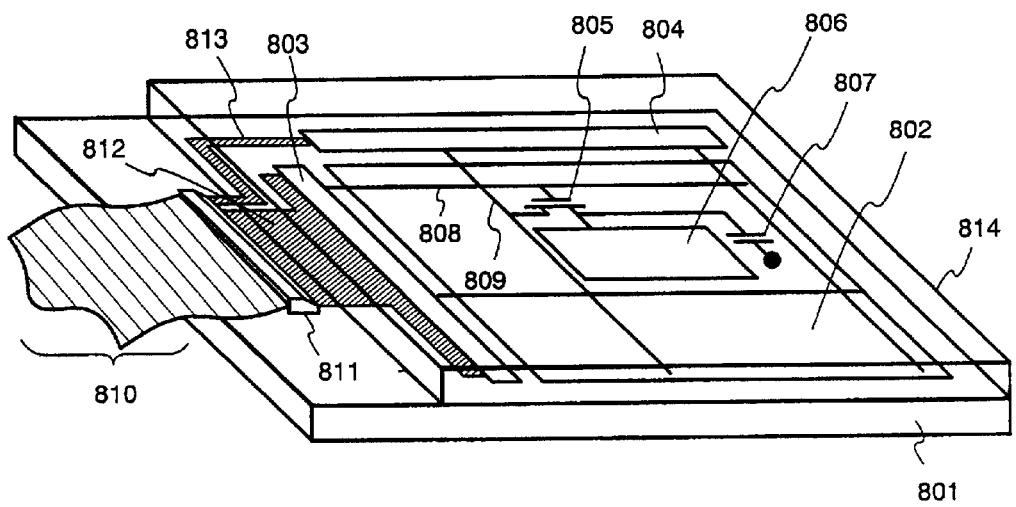
FIG. 10 is a perspective view of an active matrix liquid crystal display device.

It is to be noted that, though the semiconductor device illustrated in FIG. 10 is herein referred to as an active matrix liquid crystal display device, a liquid crystal panel having an FPC attached thereto such as the one illustrated in FIG. 10 is generally referred to as a liquid crystal module. Accordingly, the active matrix liquid crystal display device in the present embodiment may also be referred to as a liquid crystal module.

Embodiment 3

Figure 11:
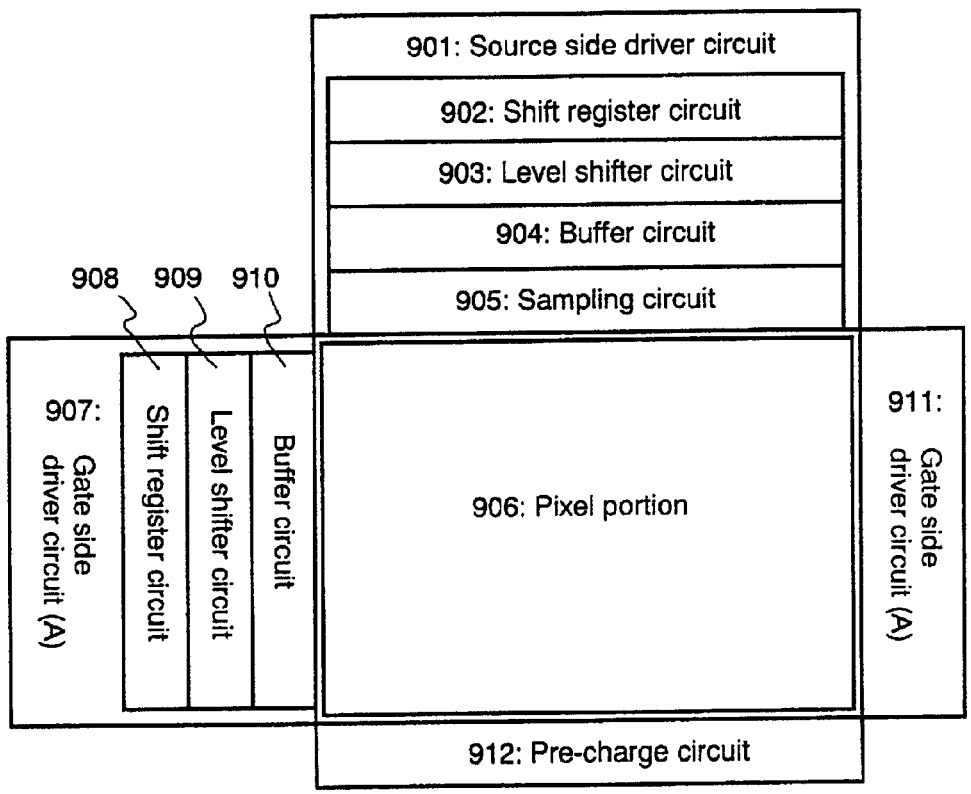
FIG. 11 is a circuit block diagram of an active matrix liquid crystal display device.

FIG. 11 shows an example of circuit structure of the active matrix substrate shown in embodiment 2. The liquid crystal display device of embodiment 3 comprises a source side driver circuit 901, a gate side driver circuit (A) 907, a gate side driver circuit (B) 911, a pre-charge circuit 912 and a pixel portion 906. Through the Specification, driver circuit is a generic name including a source side processing circuit and a gate side driver circuit.

The source side driver circuit 901 is provided with a shift register 902, a level shifter 903, a buffer circuit 904, and a sampling circuit 905. Further, the gate side driver circuit (A) 907 is provided with a shift register 908, a level shifter 909, and a buffer circuit 910. The scanning signal driver circuit (B) 911 has a similar structure.

The driver voltages for the shift register 902 and 908 is between 5 and 16 V here (typically 10 V), and the structure shown by reference numeral 702 in FIG. 8B is suitable for n-channel TFTs used in the CMOS circuits forming the circuits.

Furthermore, the driver voltage becomes high at between 14 and 16 V for the level shifter 903 and 909, and the buffer 904 and 910, but similar to the shift registers, CMOS circuits containing the n-channel TFT 702 shown in FIG. 8B are suitable. Note that using a multi-gate structure, such as a double gate structure and a triple gate structure for the gate wiring is effective in increasing reliability in each circuit.

Further, the sampling circuit 905 has a driver voltage of between 14 and 16 V, but the source region and the drain region are inverted and it is necessary to reduce the off current value, so CMOS circuits containing the n-channel TFT 703 of FIG. 8B are suitable. Note that only the n-channel TFT is shown in FIG. 8B, but in practice the n-channel TFT and a p-channel TFT are combined when forming the sampling circuit.

Further, the pixel portion 906 has a driver voltage of between 14 and 16 V, but it is necessary to reduce the off current value even lower than that of the sampling circuit 905. Therefore it is preferable to use a structure in which Lov region that causes increase in off current is not disposed, and it is preferable to use n-channel TFT 704 of FIG. 8B for the pixel TFT.

Note that the constitution of embodiment 3 can be easily realized by manufacturing a TFT according to manufacturing method shown in embodiment 1. Though the embodiment 3 shows only the structures of pixel portion and driver circuit, it is possible to form logic circuits (signal processing circuits) other than the driver circuits, such as a signal divider circuit, a D/A converter circuit, an operational amplifier circuit, and a compensation circuit, over a same substrate by following the manufacturing method of embodiment 1, and moreover, it is possible to form a memory section and a micro processor etc.

Embodiment 4

The present embodiment is an embodiment relating to the structure of a plurality of pixels forming the pixel portion, and is described with reference to FIGS. 12A and 12B.

Figure 12A:
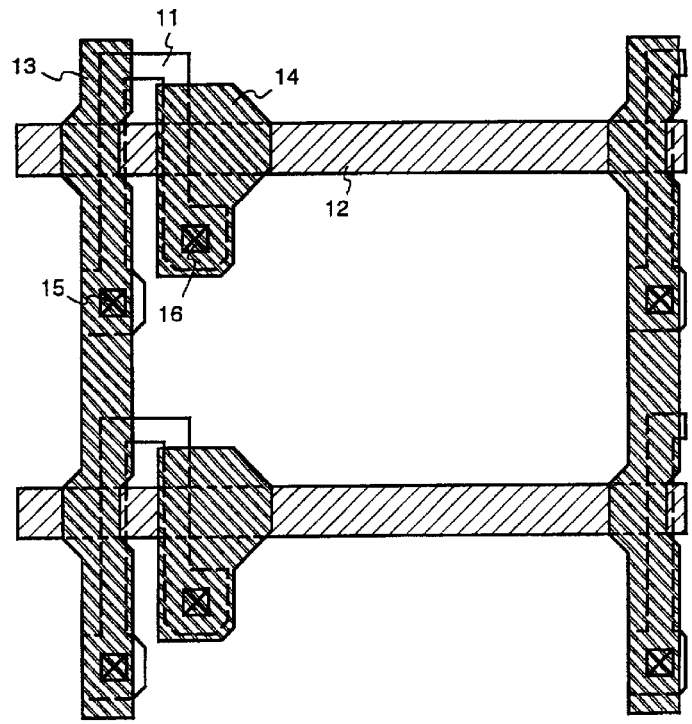
FIGS. 12A and 12B are plan views illustrating the structure of a pixel.

First, in FIG. 12A, reference numerals 11, 12, 13, and 14 denote an active layer, a gate wiring (including a gate electrode), a source wiring, and a drain wiring, respectively. Reference numerals 15 and 16 are contact portions where the source wiring 13 and the drain wiring 14 are connected with the active layer 11, respectively. This figure corresponds to a plan view of the state illustrated in FIG. 7C in Embodiment 1.

Figure 12B:
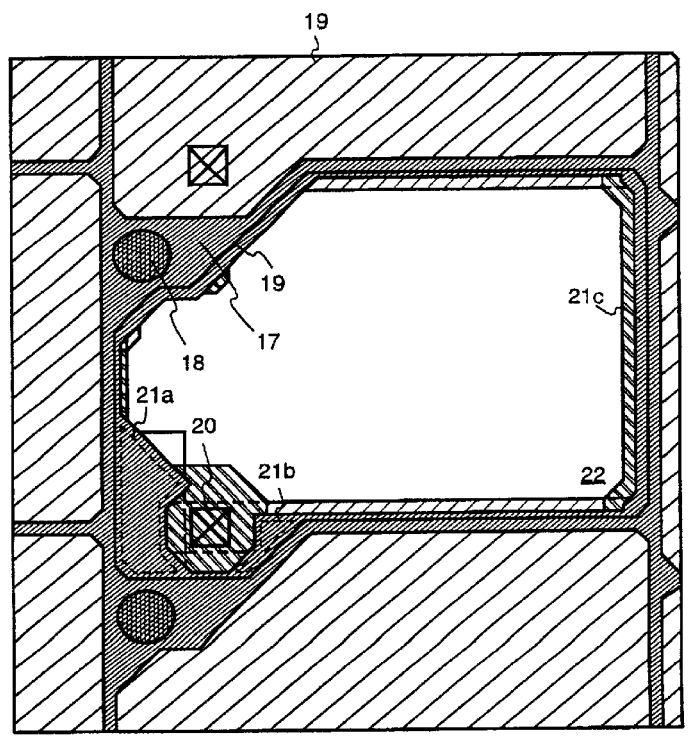

In addition, as illustrated in FIG. 12B, a shielding film 17, an oxide (not shown) formed on the shielding film 17, a spacer 18 made of a resin material and formed on the oxide, and a pixel electrode 19 are formed. Reference numeral 20 denotes a contact portion where the drain wiring 14 is connected with the pixel electrode 19. This figure corresponds to a plan view of the state illustrated in FIG. 8B in Embodiment 1.

Here, the regions where the shielding film 17, the oxide not shown, and the pixel electrode 19 overlap one another form storage capacitors. In FIG. 12B, regions 21$a$–21$c$ are storage capacitors. It is to be noted that the pixel electrode 19 overlaps the shielding film 17 also at the outer peripheral portion of the pixel, and of course, a storage capacitor is formed also in that region.

As described in the above, according to the present invention, a storage capacitor which can secure a large capacity with a small area can be formed. Further, since the spacer 18 is provided on the shielding film 17, an image display region 22 is not made smaller by the spacer 18.

It is to be noted that the pixel structure is not limited to the structure of the present embodiment. Further, the structure of the present embodiment can be formed according to the manufacturing processes of Embodiment 1, and can be used as a pixel in the liquid crystal display device of Embodiments 2 and 3.

Embodiment 5

In the present embodiment, an active matrix liquid crystal display having a pixel portion structured differently from that of Embodiment 1 is described with reference to FIG. 13. Since its basic structure is similar to the structure illustrated in FIG. 8B, only different points are described. All the other portions which are not specifically described are as described in FIG. 8B.

Figure 13:
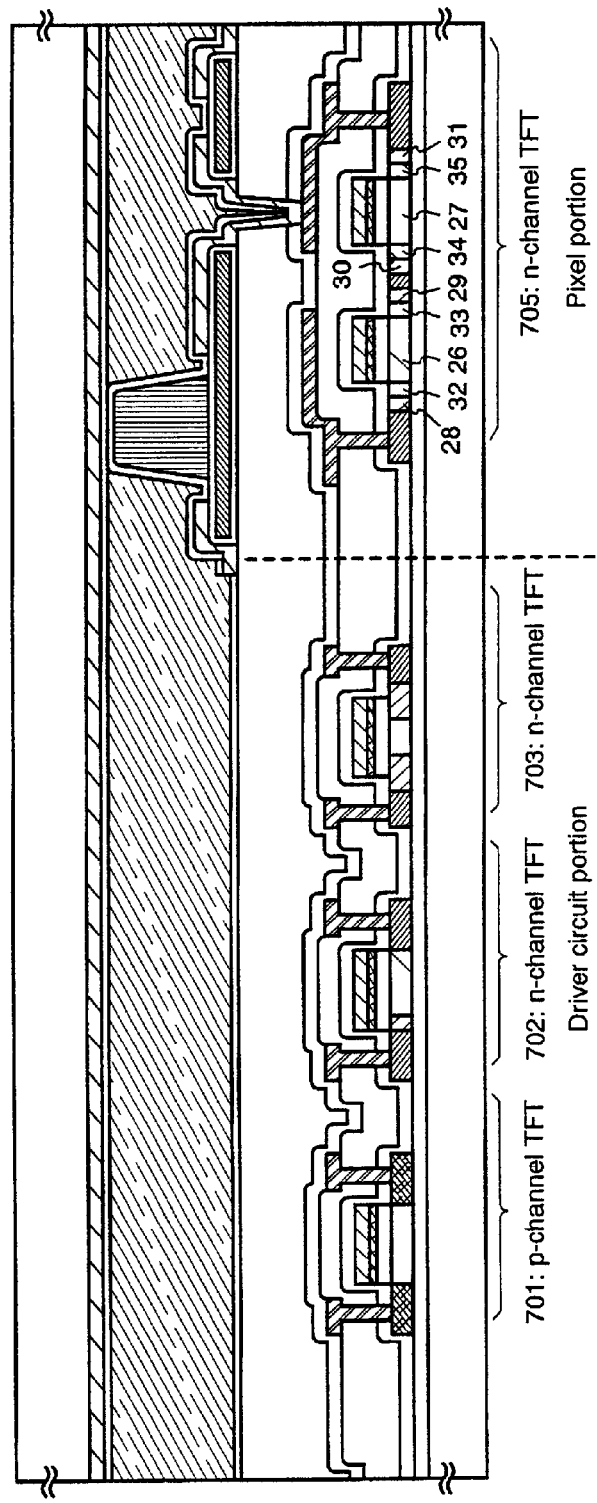
FIG. 13 is a sectional view of an active matrix liquid crystal display device.

In the structure illustrated in FIG. 13, the structure of a pixel TFT (n-channel type TFT) 705 forming the pixel portion differs from that in Embodiment 2. More specifically, in the present embodiment, offset regions 32–35 are formed between channel forming regions 26 and 27 and LDD regions (Loff regions) 28–31 made of n type impurity regions (c), respectively.

It is to be noted that an offset region means, as 32–35, a semiconductor layer the composition of which is the same as that of a channel forming region (the impurity element contained in the region is the same as that contained in the channel forming region) and which does not overlap a gate electrode. The offset regions 32–35 function as mere resistances and are highly effective in decreasing the off-state current value.

In order to materialize such a structure, for example, in the process illustrated in FIG. 6D in Embodiment 1, before adding the n type impurity element, an insulating film containing silicon is formed at the thickness of 20–200 nm (preferably 25–150 nm) so as to cover the gate wiring and the like.

Since the impurity element is added with the side walls of gate electrodes 524$a$ and 524$b$ having the insulating film formed thereon, the offset regions 32–35 are formed with the portions being the mask. Accordingly, the length of the offset regions 32–35 formed in this way substantially equals the thickness of the insulating film, and is 20–200 nm (preferably 25–150 nm).

The material of the insulating film is preferably the same as that of the gate insulating film, since, if so, the insulating film can be removed simultaneously with the gate insulating film in the process illustrated in FIG. 6E.

It is to be noted that the structure of the present embodiment can be materialized by modifying part of the processes described in Embodiment 1, and can be freely combined with any structure described in Embodiments 2–4.

Embodiment 6

By fixing the potential of an electrode which is not connected with a pixel electrode (the shielding film in the present invention), a storage capacitor can be formed at each pixel of the pixel portion. In this case, the potential of the shielding film is preferably set to be in a floating state (electrically isolated state) or at common potential (the intermediate potential of picture signals sent as data).

In the present embodiment, the connecting method in case the shielding film is fixed to the common potential is described with reference to FIGS. 14A and 14B. It is to be noted that, since its basic structure is similar to the structure of the pixel portion described with reference to FIG. 8B, like reference numerals designate like parts.

Figure 14A:
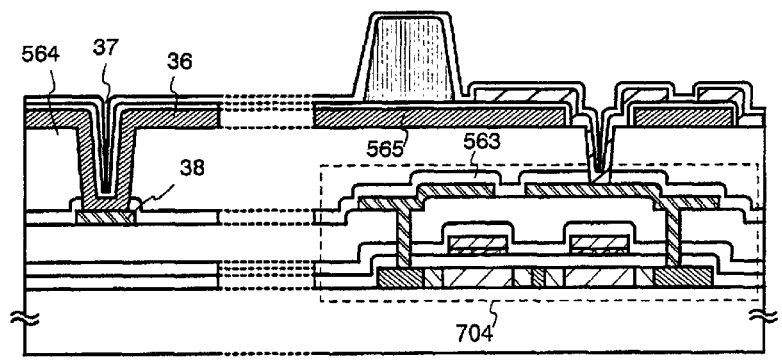
FIGS. 14A and 14B are sectional views illustrating the connecting structure between a pixel portion and a power source line, and a shielding film.

With reference to FIG. 14A, a reference numeral 704 denotes a pixel TFT (n-channel TFT) formed in a similar way as that of Embodiment 1, and a reference numeral 565 denotes a shielding film which functions as one electrode of a storage capacitor. A shielding film 36 extendingly existing outside the pixel portion is connected with a power supply line 38 for giving the common potential through a third interlayer insulating film 564 and a contact hole 37 provided in a passivation film 563. The power supply line 38 may be formed simultaneously with a source wiring or a drain wiring.

In this way, by electrically connecting the shielding film 36 with the power supply line 38 for giving the common potential at the outside of the pixel portion, the shielding film 565 can be held at the common potential.

Figure 14B:
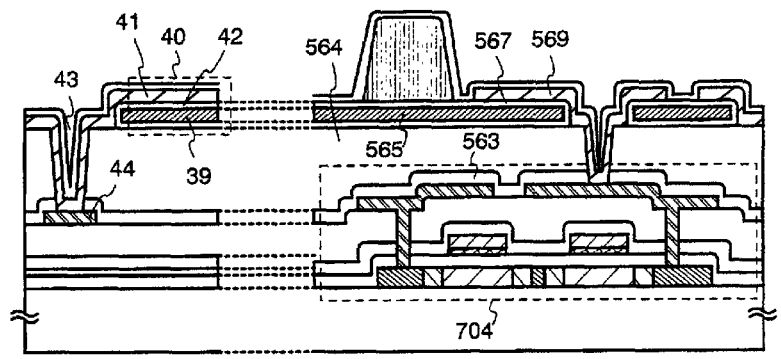

Next, with reference to FIG. 14B, the reference numeral 704 denotes the pixel TFT formed in a similar way as that of Embodiment 1, and the reference numeral 565 denotes the shielding film which functions as one electrode of the storage capacitor. A shielding film 39 extendingly existing outside the pixel portion overlaps a conductive film 41 through an oxide 42 in a region denoted as 40. The conductive film 41 is formed simultaneously with a pixel electrode 569.

The conductive film 41 is connected through a contact hole 43 with a power supply line 44 for giving the common potential. Here, in the region 40, a capacitor made of the shielding film 39, the oxide 42, and the conductive film 41 is formed. If the capacitance of the capacitor is large enough (about ten times as large as the capacitance in total of all storage capacitors connected with all pixels for one scanning line), the potential fluctuation of the shielding films 39 and 565 can be decreased by the electrostatic coupling formed in the region 40.

In case the structure illustrated in FIG. 14B is adopted, source line invert driving is preferably adopted as the method of driving the active matrix liquid crystal display device. In the source line invert driving, since the polarity of the voltage applied to a pixel electrode is reversed with regard to each one frame, charge accumulated at the shielding film 565 is almost zero when temporally averaged, that is, a state where the potential fluctuation is very small can be maintained, and thus, a stable storage capacitor can be formed.

In this way, by adopting the structure illustrated in FIG. 14B, the shielding film can be held at the common potential without increasing the number of the processes.

It is to be noted that the structure of the present embodiment can be materialized only by modifying part of the manufacturing processes described in Embodiment 1, and the rest of the processes are similar to those in Embodiment 1. Further, the structure of the present embodiment can be freely combined with any structure described in Embodiments 2–5.

Embodiment 7

An example of anodic oxidation method in forming an anodic oxide film 567 in embodiment 1 is descried in Embodiment 7.

In the present embodiment, a tartaric acid ethylene glycol solution with a sufficiently low alkaline ion concentration is first manufactured. This is a solution in which a 15% tartaric acid ammonium aqueous solution and an ethylene glycol solution are mixed in a 2:8 ratio. Aqueous ammonia is added thereto so that the pH is regulated to be 7±0.5. A platinum electrode is placed in the solution as a cathode, the substrate on which the shielding film 565 is formed is immersed in the solution, and a constant dc current is applied with the shielding film 565 as an anode. Note that the amount of dc current varies by the surface area of the shielding film 565 subjected to an anodic oxidation and it may be set at 30 to 100 $\mu A/cm^2$, preferably 50 to 70 $\mu A/cm^2$. It is set at 60 $\mu A/cm^2$ in the present embodiment.

The voltage between the cathode and the anode in the solution changes along with time in accordance with the oxide film growth. The voltage is increased at an increase rate of 100 V/min under a constant current, and the anodic oxidation process is stopped when the voltage becomes 45 V. Thus the anodic oxide substance 567 can be formed with a thickness of approximately 50 nm on the surface of the shielding film 565. As a result, the thickness of the shielding film 565 will be 90 nm. Note that the numerical values shown here for the anodic oxidation process are only examples, and that they may naturally be changed to the most suitable values depending upon the size of the element being manufactured, etc.

By performing an anodic oxidation treatment as shown above, inferiority of adhesiveness of the shielding film 565 will not be a problem even in case of directly forming the shielding film 565 on the third interlayer insulating film 564. In other words, the process for fabricating a silicon oxide film 566 can be omitted in the process of FIG. 7D.

Note that the present embodiment merely altered the conditions for the anodic oxidation treatment of Embodiment 1 and it is possible to freely combine the present embodiment with any constitution of embodiments 2 to 6.

Embodiment 8

In Embodiment 1, after the process illustrated in FIG. 5B, the crystalline silicon film 504 is patterned, the active layers 505–508 are formed, and then the p type impurity region (b) and the n type impurity region (b) are formed. On the other hand, according to the present invention, the p type impurity region (b) and the n type impurity region (b) may be formed before the crystalline silicon film 504 is patterned.

In this case, the process of activating the p type impurity region (b) and the n type impurity region (b) (which corresponds to the laser annealing process illustrated in FIG. 5F of Embodiment 1) can be carried out before the crystalline silicon film is patterned. Therefore, the inconvenience that the optimum condition of the laser annealing process varies depending on the pattern design (the position and shape of the active layer and the like) can be prevented. In other words, there is an advantage that the degree of freedom in design when the TFT is formed is improved.

It is to be noted that the present embodiment can be materialized by merely changing the order of the processes in Embodiment 1, and can be freely combined with any structure described in Embodiments 2–7.

Embodiment 9

Though, in the manufacturing processes illustrated in Embodiment 1, the channel doping process is carried out only with regard to the region to be the n-channel TFT to control the threshold voltage, the channel doping process may be carried out with regard to the whole surface without discriminating the n-channel TFT and the p-channel TFT. In this case, since the number of the photomasks necessary in the manufacturing process is decreased, the throughput and the yield of the process can be improved.

Further, depending on the situation, the channel doping process may be carried out with regard to the whole surface and an impurity element for giving the opposite conductive type to that of the impurity element added to the whole surface may be added to either the n-channel TFT or the p-channel TFT.

It is to be noted that the structure of the present embodiment can be freely combined with any structure described in Embodiments 1–8.

Embodiment 10

In the manufacturing processes of Embodiment 1, the semiconductor film containing crystal structure is formed using a catalytic element for facilitating the crystallization. In the present embodiment, a case where a semiconductor film containing crystal structure is formed using thermal crystallization or laser crystallization and without using such a catalytic element is described.

In case of thermal crystallization, after a semiconductor film containing amorphous structure is formed, a heat treatment process is carried out at 600–650° C. for 15–24 hours. By carrying out the heat treatment at 600° C. or above, natural nuclei are generated and the crystallization progresses.

In case of laser crystallization, after a semiconductor film containing amorphous structure is formed, a laser annealing process is carried out on the first annealing condition described in Embodiment 1. This makes it possible to form a semiconductor film containing crystal structure in a short time. Of course, lamp annealing can be carried out instead of laser annealing.

As described in the above, a semiconductor film containing crystal structure for the TFT can be formed using any known means. It is to be noted that the present embodiment can be freely combined with any structure described in Embodiments 1–9.

Embodiment 11

In the present embodiment a technique disclosed in Embodiment 1 of the Specification of Japanese Patent Application No. Hei 11-76967 as a fabrication method for the crystalline silicon film which forms an active later of a TFT. According to the fabrication process of embodiment 1 in the above stated specification, a crystalline silicon film of a specific crystalline structure can be obtained.

Japanese Patent Application No. Hei 10-044659, Hei 10-152316, Hei 10-152308 or Hei 10-152305 by the Applicant may be referred regarding details of the crystalline silicon film. A summary of the characteristic of the crystalline structure which is experimentally analyzed by the Applicant is described below. Note that it is presumed that this characteristic coincides with the characteristic of the semiconductor layers which form active layers of TFTs completed by implementing the present embodiment.

The above stated crystalline silicon film has a crystal structure in which a plurality of needle-like or column-like crystals (hereinafter abbreviated as column-like crystals) are gathered and aligned when viewed microscopically. This may readily be confirmed through observation using TEM (transmission electron microscopy).

A {110} plane can be observed as an orientated film whose crystal axis is more or less shifted by electron diffraction on its surface (where a channel is to be formed). This can be confirmed from the fact that the diffraction spots having regularity unique to {110} plane are found through an electron diffraction photograph with a spot diameter of 1.35 μm. It is also confirmed that the spots are distributed on a concentric circle.

Further, when the orientation ratio is calculated by X-ray diffraction (specifically, X-ray diffraction using the é-2é method), the orientation ratio of {220} plane is 0.7 or more (typically 0.85 or more). For the calculation of the orientation ratio, a method disclosed in Japanese Patent Application Laid-open No. Hei 7-321339 is used.

When the crystal grain boundary formed from column-like crystals that are brought into contact with one another is observed by HR-TEM (high resolution transmissive electron microscopy), it is confirmed that there is continuity in the crystal lattice in a crystal grain boundary. This is easily confirmed by the fact that lattice stripes observed are continuously connected in the crystal grain boundary.

The continuity of the crystal lattices in the crystal grain boundary is originated in that the crystal grain boundary is a grain boundary called 'planar grain boundary' The definition of the term planar grain boundary in this specification agrees with the 'planar boundary' described in "Characterization of High-Efficiency Cast-Si Solar Cell Wafers by MBIC Measurement", Ryuichi Shimokawa and Yutaka Hayashi, Japanese Journal of Applied Physics, vol. 27, No. 5, pp. 751–758, 1988.

According to the above article, the planar boundary includes a twin grain boundary, a special stacking fault, a special twist grain boundary, etc. The planar boundary is characterized by being electrically inert. In other words, it may practically be regarded as nonexisting because it does not function as a trap that inhibits movement of carriers in spite of being a crystal grain boundary.

When the crystal axis (axis that is perpendicular to the crystal plane) is <110>axis, in particular, {211} twin grain boundary is also called a corresponding grain boundary of Σ3. The Σ value is a parameter serving as an indicator showing the degree of alignment in a corresponding boundary, and it is known that a grain boundary of smaller Σ value is a grain boundary showing better alignment. When the crystalline silicon film of the present embodiment is actually observed in detail by using TEM, it is found out that the most of the crystal grain boundaries (over 90%, typically over 95%) is a corresponding grain boundary of Σ3, typically a {211} twin grain boundary.

In a crystal grain boundary formed between two crystal grains that have crystal plane orientation of {110}, it is known to make a corresponding grain boundary of Σ3 when an angle θ, which is formed by lattice stripes corresponding to a {111} plane, is 70.5°. In the crystalline silicon film obtained of this embodiment, the lattice stripes are continuous at an angle of about 70.5° in adjacent crystal grains in the crystal grain boundary. Therefore it is inferred that the crystal grain boundary is a corresponding grain boundary of Σ3.

Note that a corresponding grain boundary of Σ9 is formed when θ=70.5° and these other corresponding grain boundaries also exist. It does not make difference in the point that it is inert.

The crystal structure as such (the structure of the crystal grain boundary, to be strict) indicates that different two crystal grains are connected in a very well aligned manner in the crystal grain boundary. That is, the crystal lattices are continuously connected in the crystal grain boundary, so that a trap level caused by crystal defect or the like is hardly formed. Therefore a semiconductor thin film having such a crystal structure may be considered that it has practically no crystal grain boundary.

The TEM observation further verifies that most of the defects that have been present in crystal grains are eliminated by a heat treatment step at a high temperature of 800 to 1150° C. (a thermal oxidation process or an activation process). This is also apparent from the fact that the defects are greatly decreased in number after the heat treatment step compared with the defects before the step.

This difference in the number of defects reveals as the difference in spin density in Electron Spin Resonance (ESR) analysis. Under the present circumstances, it has been found that the crystalline silicon film of this embodiment has a spin density of at no more than $5 \times 10^{17}$ spins/cm$^3$ (preferably $3 \times 10^{17}$ spins/cm$^3$ or less). However, this measured value is near the detection limit of existing measurement devices, and hence the actual spin density of the film is expected to be even lower.

From the facts stated above, the crystalline silicon film of the present embodiment has extremely small number of defects in the crystal grain and has practically no crystal grain boundary. Therefore it may be regarded as a monocrystal silicon film or an essentially monocrystal silicon film.

It is possible to use the crystalline silicon film having above stated unique crystal structure as an active layer of a TFT by implementing the present embodiment. A TFT which shows a n excellent electric performance can be thus formed and it is further possible to enhance the operation performance of a semiconductor device.

Note that it is possible to implement the constitutions of the present embodiment by altering a part of processes in Embodiment 1. It is possible to combine the present embodiment with any constitution of Embodiments 2 to 10.

Embodiment 12

Figure 15A:
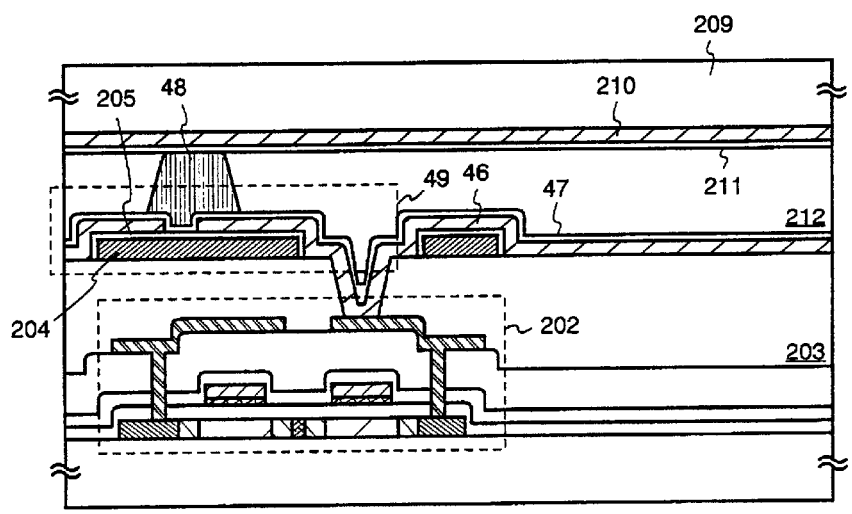
FIGS. 15A and 15B illustrate the pixel structure of the liquid crystal display device.

In the present embodiment, a pin hole formed in a dielectric of a storage capacitor is filled up according to processes different from those of Embodiment 1. First, with reference to FIG. 15A illustrating the pixel structure of the present embodiment, similarly to the case illustrated in FIGS. 2A and 2B, the shielding film 204 and the oxide 205 are provided through the leveling film 203 on the TFT 202.

Figure 15B:
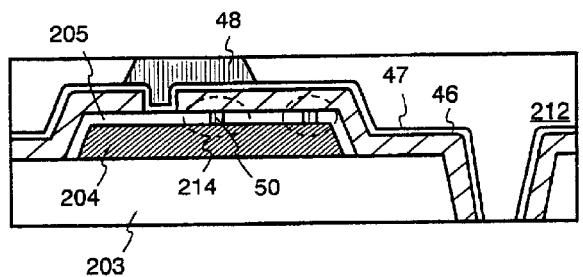

Then, a pixel electrode 46 is provided so as to overlap the shielding film 204 through the oxide 205, an alignment film 47 is provided so as to cover the pixel electrode 46, and a spacer 48 made of a resin material is formed on the alignment film 47. It is to be noted that FIG. 15B is an enlarged view of a region surrounded by a dashed line 49 in FIG. 15A. As illustrated in FIG. 15B, the pin hole 214 formed in the oxide 205 is filled up with a filler 50.

In Embodiment 1, the pin hole in the dielectric of the storage capacitor is filled up using the material of the space simultaneously when the spacer made of the resin material is formed. In the present embodiment, the pin hole is filled up in advance before the pixel electrode 46 is formed, and after that, the pixel electrode 46, the alignment film 47, and the spacer 48 are formed.

Here, the process of filling up the pin hole used in the present embodiment is described with reference to FIGS. 16A to 17B.

First, according to the manufacturing processes of Embodiment 1, the processes up to the one illustrated in FIG. 7D are completed. Here, suppose that pin holes 51a and 51b have been formed in the anodic oxide 567 due to attached dust or the like when the anodic oxidation was carried out.

Figure 16A:
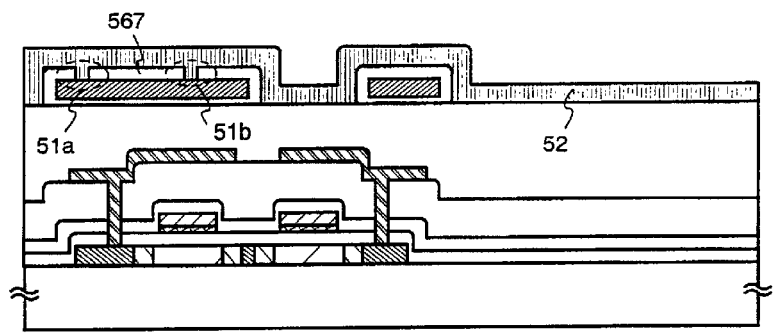
FIGS. 16A and 16B illustrate manufacturing steps of the pixel structure of a liquid crystal display device.

Then, a resin insulating film (in the present embodiment, a polyimide film) 52 is formed at the thickness of 0.1–1 µm (typically 0.2–0.3 µm). Here, the pin holes 51a and 51b are filled up with the resin insulating film 52 (FIG. 16A).

Figure 16B:
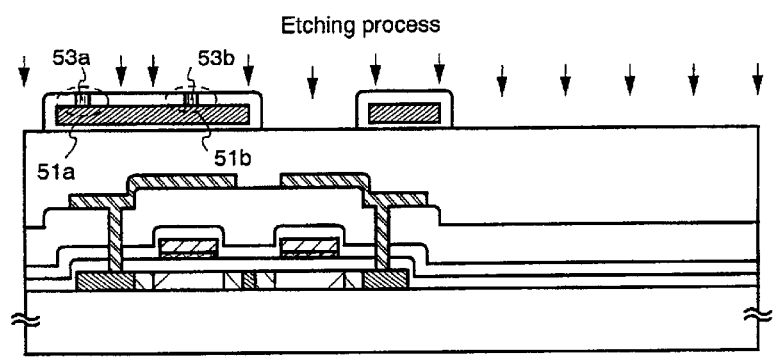

Next, plasma is formed using oxygen gas. By exposing to the plasma the substrate to be treated, the resin insulating film 52 is etched. This etching is known as an ashing process of the resin material (FIG. 16B).

Though, by this process, the resin insulating film 52 formed on the anodic oxide 567 is completely removed, part of the resin insulating film filled into the pin holes 51a and 51b are thought to remain unremoved. In other words, as illustrated in FIG. 16B, a state where the pin holes 51a and 15b are filled up with part of the resin insulating film 52 (fillers 53a and 53b) can be obtained.

Figure 17A:
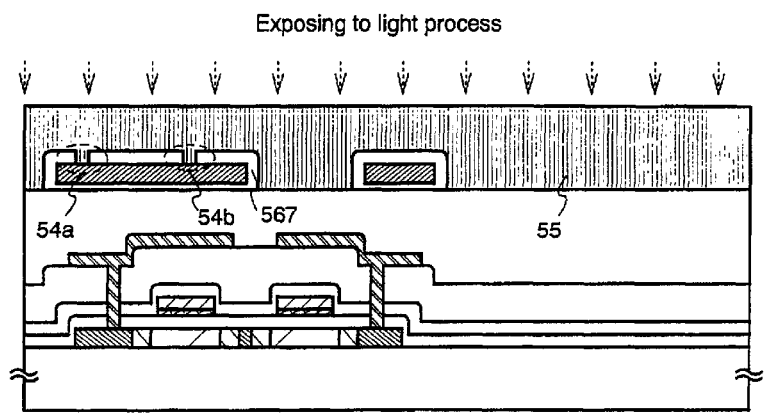
FIGS. 17A and 17B illustrate manufacturing steps of the pixel structure of the liquid crystal display device.
Figure 17B:
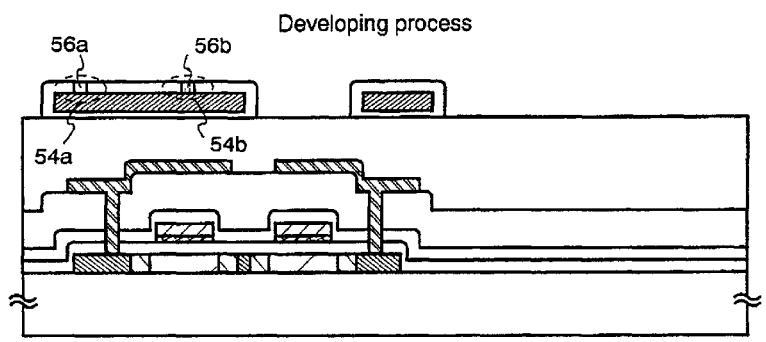

Alternatively, a process as illustrated in FIGS. 17A and 17B may be used. First, according to the manufacturing processes of Embodiment 1, the processes up to the one illustrated in FIG. 7D are completed. Here, suppose that pin holes 54a and 54b have been formed in the anodic oxide 567 due to attached dust or the like when the anodic oxidation was carried out.

Then, a resin insulating film (in the present embodiment, an acrylic resin film having positive photosensitivity) 55 is formed at the thickness of 0.1–1 µm (typically 0.2–0.3 µm). Here, the pin holes 54a and 54b are filled up with the resin insulating film 55 (FIG. 17A).

Next, the resin insulating film 55 is exposed to light under an ordinary exposure condition, and the exposed resin insulating film 55 is removed by an ordinary development process. Though, by this process, the resin insulating film 55 formed on the anodic oxide 567 is completely removed, part of the resin insulating film filled into the pin holes 54a and 54b are thought to remain unexposed, and consequently, remain unremoved. In other words, as illustrated in FIG. 17B, a state where the pin holes 54a and 54b are filled up with part of the resin insulating film 55 (fillers 56a and 56b) can be obtained.

After the state illustrated in FIG. 16B or 17B is obtained, the pixel electrode 46, the alignment film 47; and the spacer 48 are formed. Then, by carrying out the process of cell assembling, the pixel structure illustrated in FIG. 15A can be obtained.

It is to be noted that the structure of the present embodiment can be freely combined with any structure described in Embodiments 2–11.

Embodiment 13

Figure 18A:
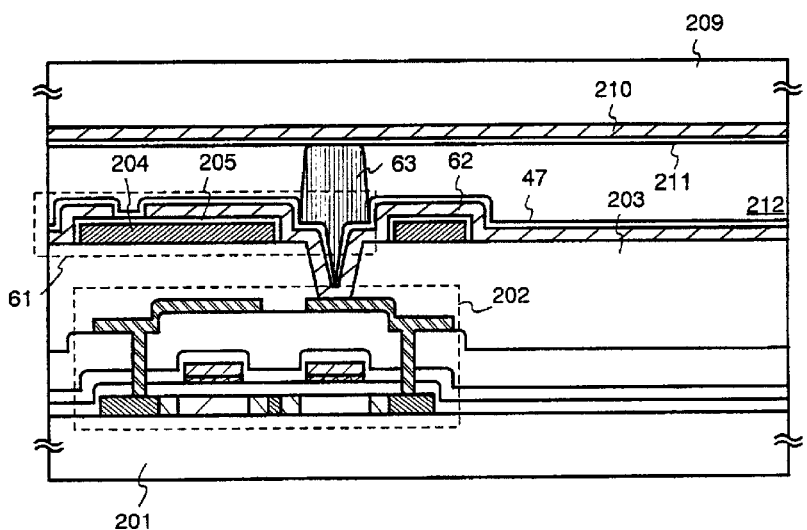
FIGS. 18A and 18B illustrate the pixel structure of a liquid crystal display device.
Figure 18B:
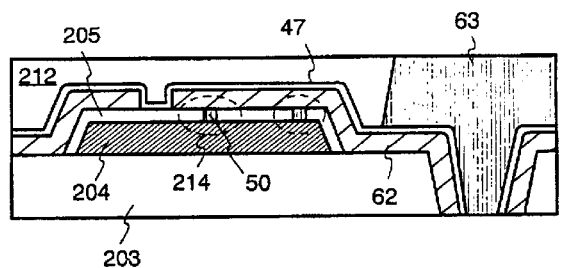

In the present embodiment, a spacer made of a resin material is formed at a position different from that in the pixel structure described with reference to FIGS. 15A and 15B. It is to be noted that the pixel structure itself illustrated in FIG. 18A is the same as that illustrated in FIG. 15A, and only the position where a spacer is formed is different. FIG. 18B is an enlarged view of a region surrounded by a dashed line 61 in FIG. 18A.

In the present embodiment, a spacer 63 is provided above a contact portion where the pixel TFT 202 is connected with a pixel electrode 62. The structure of the present embodiment makes it possible to fill up a step formed at the contact portion (the thickness of the interlayer insulating film 203), and misorientation of liquid crystal molecules due to the step can be prevented.

Figure 19:
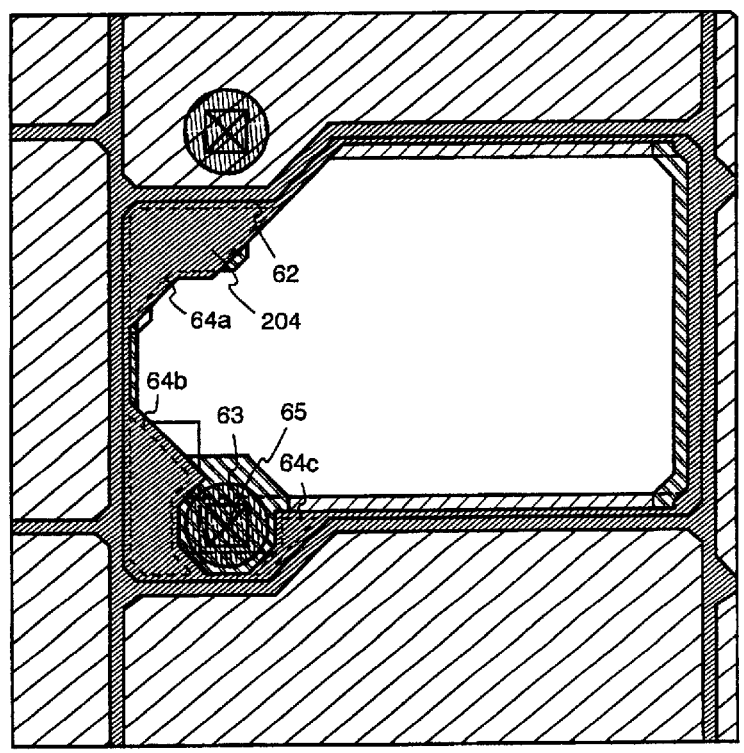
FIG. 19 is a plan view illustrating the structure of a pixel.

FIG. 19 is a plan view of the pixel structure of the present embodiment. In FIG. 19, the pixel electrode 62 is provided on the shielding film 204 through the oxide 205 which is not shown. Here, the shielding film 204, the oxide 205, and the pixel electrode 62 form storage capacitors 64a–64c.

Further, the spacer 63 made of a resin material is formed above the contact portion 65 of the pixel electrode. Such a spacer made of a resin material has an advantage that its position can be freely determined in designing.

It is to be noted that both of the spacer 63 of the present embodiment and the spacer 48 (see FIG. 15A) described in Embodiment 12 can be used jointly, or can be used in their respective right places depending on the positions of the pixels. Further, the structure of the present embodiment can be freely combined with any structure described in Embodiments 2–12.

Embodiment 14

In the present embodiment, a structure different from the pixel structure described in Embodiment 12 is described with reference to FIG. 20. It is to be noted that like reference numerals designate like parts in FIGS. 15A and 15B.

Figure 20:
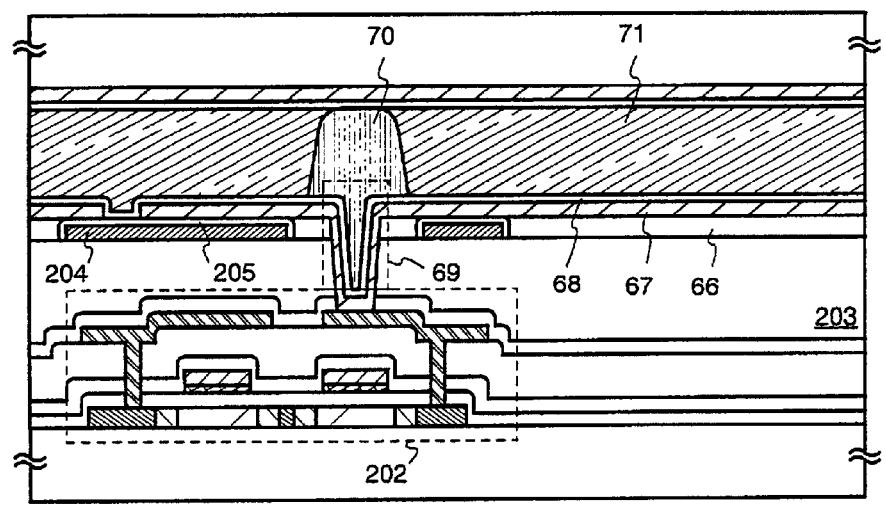
FIG. 20 illustrates the pixel structure of a liquid crystal display device.

As illustrated in FIG. 20, the shielding film 204 is provided on the TFT 202 through the interlayer insulating film 203. The oxide 205 is formed on the shielding film 204. In the present embodiment, after the oxide 205 is formed, a resin insulating film 66 is formed to flatten the step formed by the shielding film 204 and the oxide 205.

The resin insulating film 66 is first formed so as to be thick enough (at least until the step formed by the shielding film 204 and the oxide 205 is flattened). By etching with plasma, machine polishing, or electro-polishing, the film thickness is decreased until the thickness of the remaining resin insulating film substantially equals the height of the step.

After that, a pixel electrode 67 and an alignment film 68 are formed. Then, a spacer 70 is formed by patterning above a contact portion 69 of the pixel electrode.

According to the present embodiment, since not only the step formed by the shielding film 204 and the oxide 205 is flattened but also the contact portion of the pixel electrode is flattened, a pixel electrode which is highly flat can be formed. As a result, the electric field formed in liquid crystal 71 is highly even, and thus, misorientation of the liquid crystal can be remarkably decreased. Accordingly, bright and highly precise image display can be made.

It is to be noted that the structure of the present embodiment can be freely combined with any structure described in Embodiments 2–13.

Embodiment 15

In the present embodiment, the arrangement of the spacers outside the pixel portion is described with reference to FIGS. 21A and 21B.

Figure 21A:
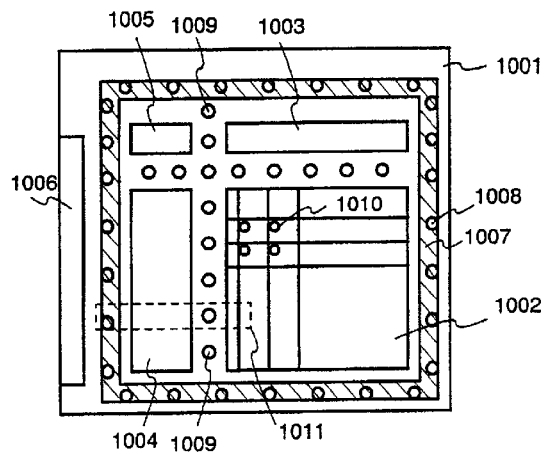
FIGS. 21A and 21B illustrate positions where spacers are formed.

In FIG. 21A, in an active matrix substrate 1001 manufactured according to the processes described in Embodiment 1, a pixel portion 1002, a driver circuit 1003 on the gate side, a driver circuit 1004 on the source side, a signal dividing circuit 1005, and an external connecting terminal (I/O port) 1006 are formed.

An opposing substrate which is not shown is laminated to the active matrix substrate 1001 through a sealing member (typically an epoxy resin material) 1007, and liquid crystal is encapsulated in a region surrounded by the sealing member 1007. Ball-like or bar-like hard spacers called fillers (spacers made of an inorganic material) are added in advance to the sealing member 1007, and are disposed simultaneously when the sealing member is screen printed on the active matrix substrate.

In the present embodiment, spacers (first spacers) 1008 are formed by carrying out photolithography with regard to the portion where the sealing member 1007 is formed. Further, spacers 1009 (second spacers) are formed by photolithography in gaps among the pixel portion 1002, the driver circuit 1003 on the gate side, the driver circuit 1004 on the source side, the signal dividing circuit 1005, and the like. Still further, in the pixel portion, spacers (third spacers) 1010 are formed by photolithography at positions illustrated in FIGS. 12B and 19.

Figure 21B:
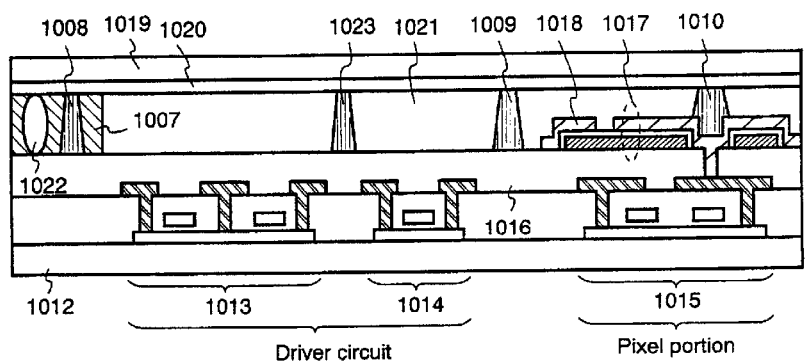

FIG. 21B is a schematic enlarged view of a region denoted as 1011. A CMOS circuit 1013 forming a shift register circuit and the like, a sampling circuit 1014, and a pixel TFT 1015 formed in the pixel portion are formed on a substrate 1012, and a storage capacitor 1017 and a pixel electrode 1018 are formed through an interlayer insulating film 1016.

Reference numerals 1019 and 1020 denote an opposing substrate and an opposing electrode, respectively. Liquid crystal 1021 is encapsulated between the opposing substrate 1019 and the active matrix substrate through the spacers. Here, the sealing member 1007 contain spacers formed of a resin material (first spacers) 1008 and spacers made of an inorganic material (fillers) 1022.

The spacers formed of a resin material (second spacers) 1009 are formed in a gap between the driver circuit formed of the CMOS circuit 1013, the sampling circuit 1014, and the like and the pixel portion. In the driver circuits, spacers made of a resin material (fourth spacers) 1023 may be provided in gaps between circuits or between devices, such as in a gap between the shift register circuit and the sampling circuit.

In FIG. 21B, the spacer made of a resin material (third spacer) 1010 is formed above a contact portion where the pixel TFT 1015 is connected with the pixel electrode 1018. It is to be noted that a spacer made of a resin material may be additionally provided above the storage capacitor 1017. Or, it is also possible to provide a spacer made of a resin material only above the storage capacitor 1017 and not above the contact portion.

As described in the above, since the spacers made of a resin material are formed by photolithography, their arrangement can be freely determined in designing. The present embodiment makes use of this advantage, and is characterized in that spacers are selectively provided in regions where TFTs are not formed.

It is to be noted that the spacers 1008–1010 and 1023 in FIG. 21B are not necessarily required to be used simultaneously, and only one among them or a freely determined combination of them may be used.

For example, in an active matrix liquid crystal display device the length of a diagonal line of which is 1 inch or less, there are some cases where, since the panel size is small enough, it is sufficient that only the first spacers 1008 are provided where the sealing member is formed. Of course, a combination of the first spacers 1008 and the second spacers 1009, a combination of the first spacers 1008 and the fourth spacers 1023, or a combination of the first spacers 1008, the second spacers 1009, and the fourth spacers 1023 may be used.

Or, the places where the sealing member is formed may have only the spacers 1022 made of an inorganic material, and a combination of the second spacers 1009 and the third spacers 1010 or a combination of the fourth spacers 1023 and the third spacers 1010 may be used.

Or, it may be that no spacer is disposed in the vicinity of the driver circuits, and a combination of the first spacers 1008 and the third spacers 1010 is used.

Or, a combination of the first spacers 1008, the third spacers 1010, and the fourth spacers 1023 or a combination of the first spacers 1008, the second spacers 1009, and the third spacers 1010 may be used.

Figure 2A:
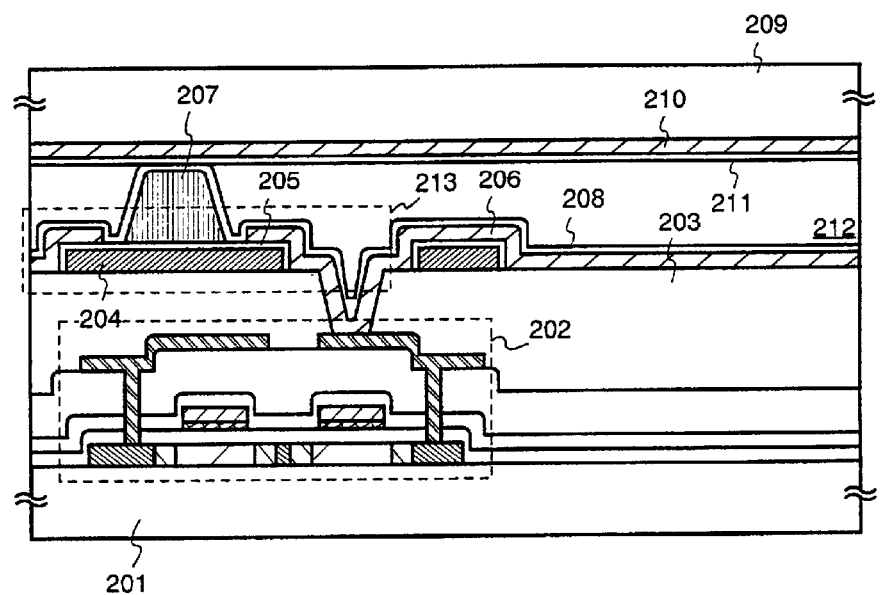
FIGS. 2A and 2B illustrate the pixel structure of a liquid crystal display device.
Figure 2B:
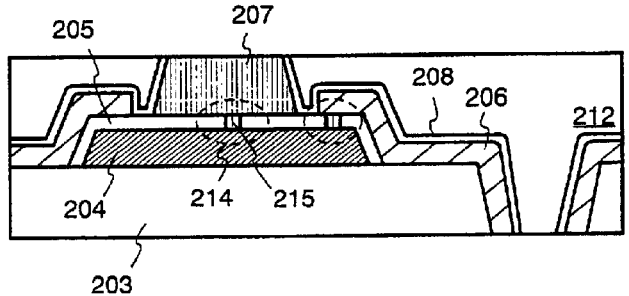
Figure 3:
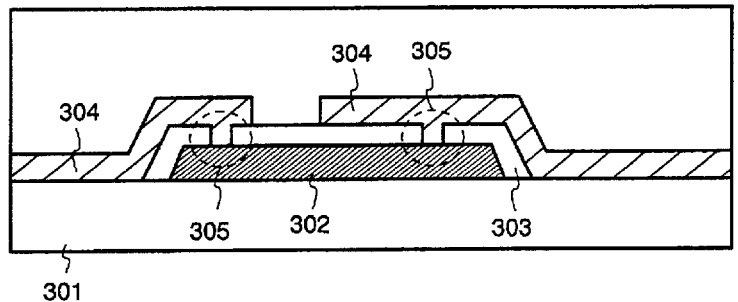
FIG. 3 illustrates the structure of a capacitor before improvement according to the present invention.

Further, though the structure of the pixel portion of the present embodiment is the structure described with reference to FIGS. 18A and 18B, it may be the structure described with reference to FIGS. 2A and 2B.

It is to be noted that the structure of the present embodiment can be freely combined with any structure described in Embodiments 1–14.

Embodiment 16

The present invention can also be applied to the case in which an interlayer insulating film is formed on a conventional MOSFET using a semiconductor substrate and a TFT is formed thereon. That is, it is also possible to realize a three-dimensionally structured semiconductor device.

It is possible to use an SOI substrate such as a SIMOX, Smart-Cut (registered trademark by SOITEC INC.), ELTRAN (registered trademark by CANON INC.), etc only in a case of manufacturing a reflection type liquid crystal display device. Needless to say, it will be possible to use them for a transmission type display device when a technique forming a single crystalline semiconductor thin film over a transparent substrate by using such SOI techniques is established.

It is possible to freely combine the constitutions of the present embodiment with any of the structures of Embodiments 1 to 15.

Embodiment 17

It is possible to apply the present invention to an active matrix EL (electro luminescence) display device or an active matrix EC (electrochromic) display device. An example of implementing the present invention onto an active matrix EL display device is shown in FIG. 22 in the present embodiment.

Figure 22:
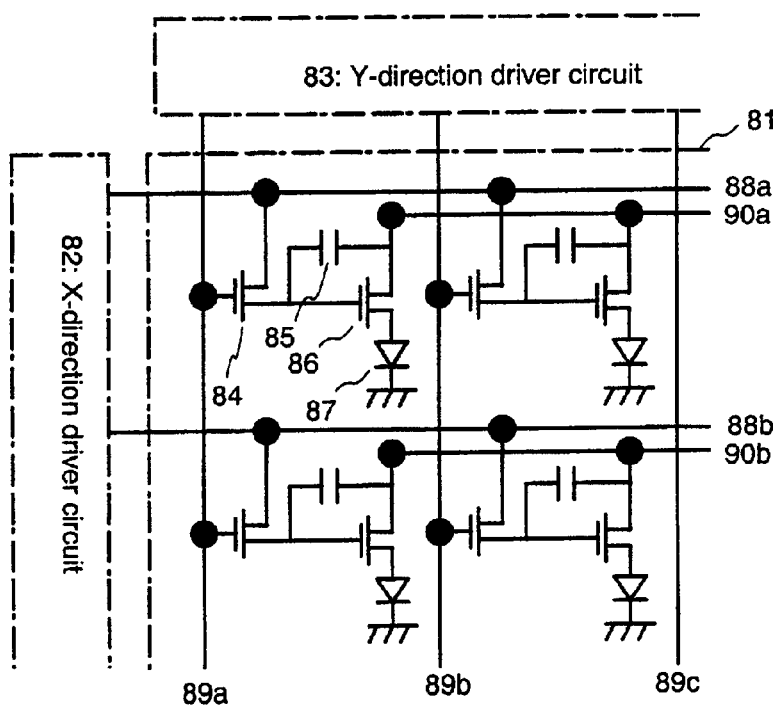
FIG. 22 illustrates the structure of an active matrix EL display device.

FIG. 22 is a circuit diagram of the active matrix EL display device. Reference numeral 81 denotes a display section; and X-direction (source side) driver circuit 82 and Y-direction (gate side) driver circuit 83 are provided in its peripheral. Each pixel of the display section 81 comprises a switching TFT 84, a capacitor 85, a current control TFT 86, an organic EL element 87. X-direction (source side) signal line 88a (or 88b) and a Y-direction (gate side) signal line 89a (or 89b or 89c) are connected to the switching TFT 84. Power supply lines 90a and 90b are connected to the current control TFT 86.

In the active matrix EL display device of the present embodiment X direction driver circuit 82 and Y direction driver circuit 83 are formed by combining a p-channel TFT 701 and an n-channel TFTs 702 or 703. The switching TFT 84 is formed from an n-channel TFT 704 of FIG. 8B, and the current control TFT 86 is formed from a p-channel TFT 701 of FIG. 8C. The capacitor 85 is formed by using a storage capacitor 572 of FIG. 8A according to the present invention.

By the way, in case of an EL display device having an operation mode in which light is irradiated towards upper side of TFTs (not through the substrate on which TFTs are formed), the pixel electrode is formed from a reflective electrode. Though where to dispose EL elements in the pixel in an EL display device differ by the pixel structure, EL elements can be formed even over the storage capacitors in case of such operation mode because all of over the pixel electrode can be used as an effective display region.

In such cases when a step due to a shielding film (it has only effect of electric field shielding in this case) exists, the EL element also has a step, which may be a cause for degrading the brightness and color of the displayed image because the light radiation direction is disturbed. The present invention is also effective as a means for solving such circumstance.

It is effective to fill out the pin holes by a filling materials comprising a resin material onto a capacitor 85 of an active matrix EL display device of the present embodiment. It is possible to freely combine the present embodiment with any constitution of embodiments 5 to 11, 12 (specifically manufacturing processes of FIGS. 16A to 17B), 14 and 16.

Embodiment 18

It is possible to use a variety of liquid crystal materials in a liquid crystal display device manufactured in accordance with the present invention. The following can be given as examples of the such materials: a TN liquid crystal; a PDL (polymer diffusion type liquid crystal) and a smectic liquid crystal. As a smectic liquid crystal, an FLC (ferroelectric liquid crystal), an AFLC (antiferroelectric liquid crystal) and a mixture of an FLC and an AFLC (antiferroelectric mixed liquid crystal) are specifically given.

For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; S. Inui et al., "Thresholdless antiferroelectricity in Liquid Crystals and its Application to Displays", 671–673, J. Mater. Chem. 6(4), 1996; and in U.S. Pat. No. 5,594,569 can be used.

In particular, there are some that exhibit electro-optical response characteristics of V shape (or U-shape) among anti-ferroelectric liquid crystal material with no threshold value (thresholdless antiferroelectric LCD: abbreviated TL-AFLC) in which transmittivity continuously differentiate against the electric field, and one having the driver voltage of approximately ±2.5 V (cell thickness approximately 1 to 2 mm) is even found. An example of showing a characteristic of light transmittivity against applied voltage, of a thresholdless antiferroelectric mixed liquid crystal which shows a V-shaped electro-optical response is shown in FIG. 23.

Figure 23:
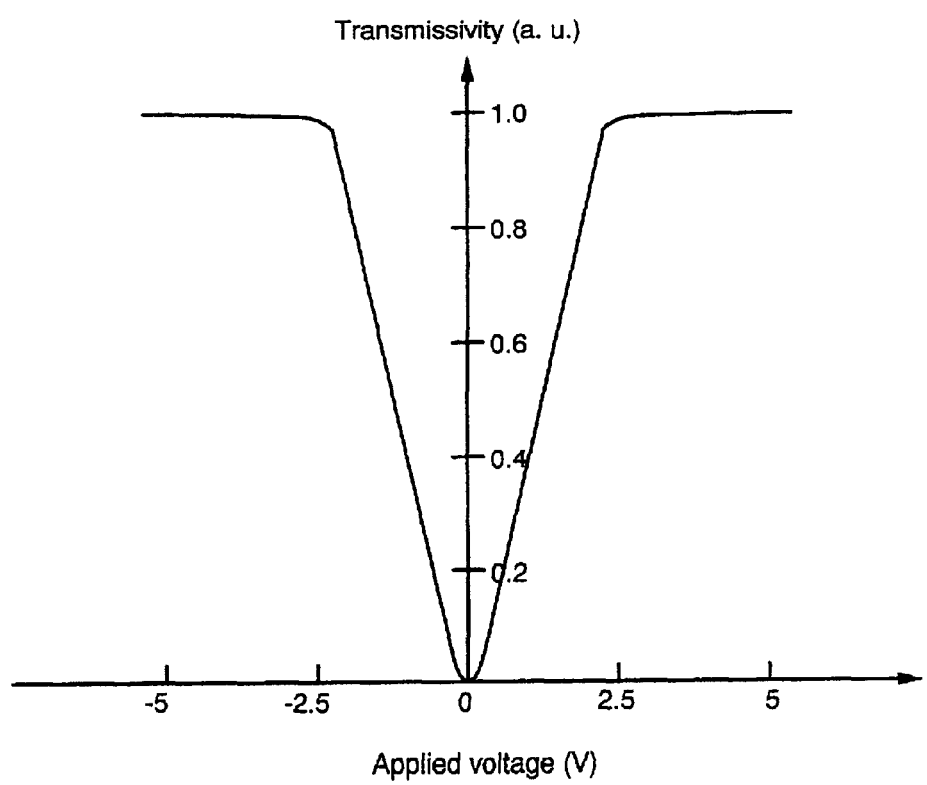
FIG. 23 is a graph showing the light transmittance characteristics of thresholdless antiferroelectric mixed liquid crystal.

The vertical axis of the graph shown in FIG. 23 is the transmissivity (in arbitrary units), and the horizontal axis is the applied voltage. Note that the transmission axis of the polarizing plate on the incidence side is set nearly in agreement with the rubbing direction of the liquid crystal display device, and nearly parallel to the direction normal to the smectic layer of the thresholdless antiferroelectric mixed liquid crystal. Further, the transmission axis of the polarizing plate on the outgoing side is set nearly perpendicular (crossed nicol) to the transmission axis of the polarizing plate on the incidence side.

As shown in FIG. 23, it is apparent that if this type of thresholdless antiferroelectric mixed liquid crystal is used, it is possible to have a low voltage drive and a gray scaled display.

Accordingly, there are cases in which the power supply voltage for the pixel circuit is required only 5 to 8 V, and possibility for operating a driver circuit and a pixel matrix circuit at the same power supply voltage is suggested. Namely, the entire liquid crystal display device can be made low power consumption.

Further, ferroelectric liquid crystals and anti-ferroelectric liquid crystals possess an advantage in that they have a high response speed compared to TN liquid crystals. Since it is possible to realize an extremely fast operating speed TFT used in the present invention, it is possible to realize a liquid crystal display device with fast image response speed by sufficiently utilizing the fast response speed of ferroelectric liquid crystals and antiferroelectric liquid crystals.

Further, thresholdless anti-ferroelectric mixed liquid crystals have large spontaneous polarization in general and dielectric constant of the liquid crystal itself is high. Therefore relatively large storage capacitance is required in the pixels in case of using the thresholdless anti-ferroelectric mixed liquid crystals in the liquid crystal display device. Accordingly, it is preferable to use a thresholdless anti-ferroelectric mixed liquid crystal which has a small spontaneous polarization.

It is needless to say that the use of the liquid crystal display device of the present embodiment to a display for personal computers, etc., is effective.

It is possible to freely combine the constitutions of the present embodiment with any constitutions of Embodiments 1 to 16.

Embodiment 19

An electro-optical device of the present invention can be used as a display section of electric appliances (also referred to as electronic machines and electronic devices). The following can be given as examples of this type of electronic devices: video cameras; digital cameras; projectors; projection TVs; goggle type displays (head mounted displays); navigation systems; sound reproduction devices; notebook type personal computers; game machines; portable information terminals (such as mobile computers, portable telephones and electronic notebooks); and image reproduction devices incorporating recording medium. Some examples of these are shown in FIGS. 24A to 26B.

Figure 24A:
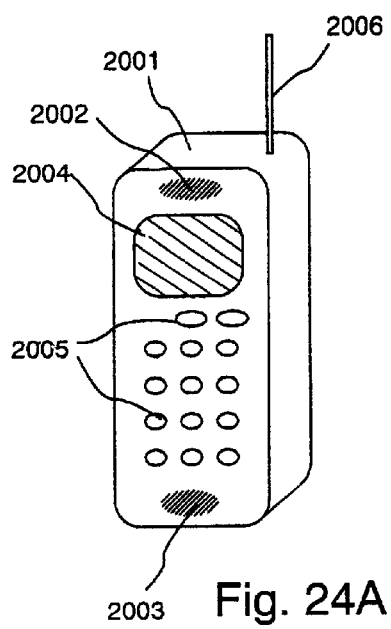
FIGS. 24A to 24F illustrate examples of electric appliance.

FIG. 24A is a portable telephone which comprises: a main body 2001; a voice output section 2002; a voice input section 2003; a display section 2004; operation switches 2005; and an antenna 2006. The electro-optical device of the present invention can be used for the display section 2004.

Figure 24B:
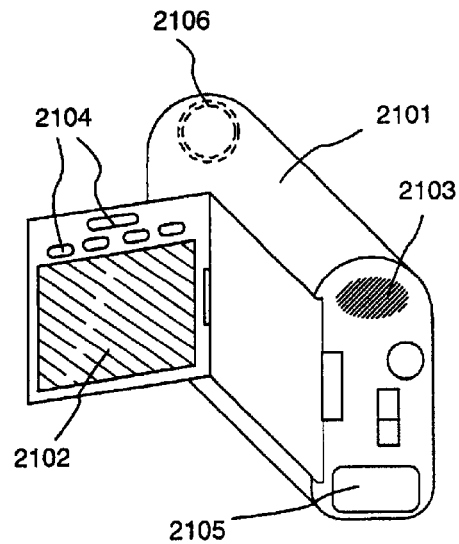

FIG. 24B is a video camera, which comprises: a main body 2101; a display section 2102; a voice input section 2103; operation switches 2104; a battery 2105; and an image receiving section 2106. The electro-optical device of the present invention can be used for the display section 2102.

Figure 24C:
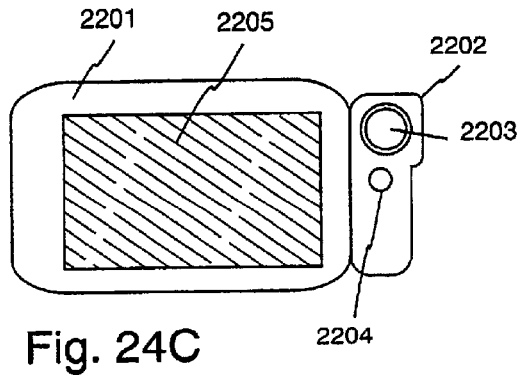

FIG. 24C is a mobile computer which comprises: a main body 2201; a camera section 2202; an image receiving section 2203; operation switches 2204; and a display section 2205. The electro-optical device of the present invention can be used for the display section 2205.

Figure 24D:
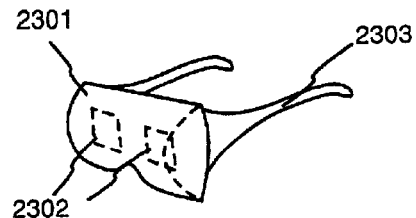

FIG. 24D is a goggle type display which comprises: a main body 2301; a display section 2302; and an arm section 2303. The electro-optical device of the present invention can be used for the display section 2302.

Figure 24E:
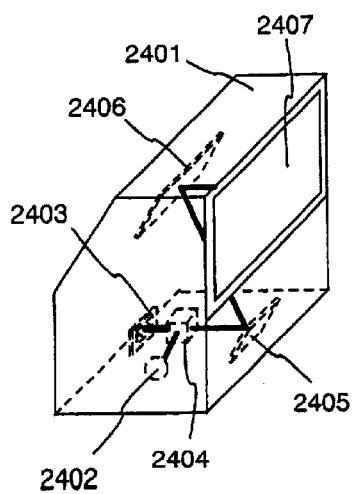

FIG. 24E is a rear projector (projection TV) which comprises: a main body 2401; a light source 2402; a liquid crystal display device 2403; a polarizing beam splitter 2404; reflectors 2405 and 2406; and a screen 2407. The present invention can be used for the liquid crystal display device 2502.

Figure 24F:
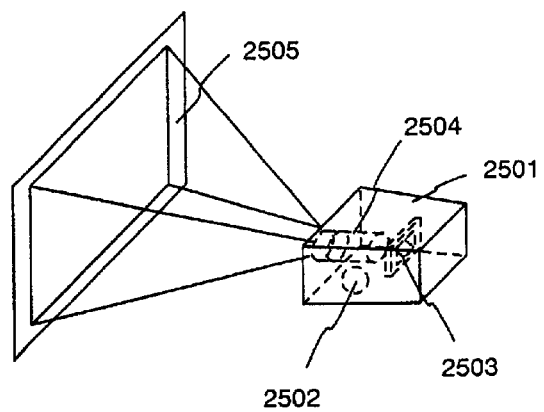

FIG. 24F is a front projector which comprises: a main body 2501; a light source 2502; a liquid crystal display device 2503; an optical system 2504; and a screen 2505. The present invention can be used in the liquid crystal display device 2503.

Figure 25A:
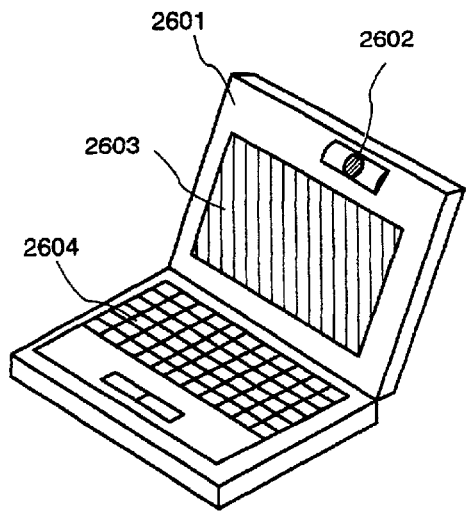
FIGS. 25A to 25D illustrate further examples of electric appliance.

FIG. 25A is a personal computer, which comprises: a main body 2601; an image input section 2602; a display section 2603; and a keyboard 2604. The electro-optical device of the present invention can be used for the display section 2603.

Figure 25B:
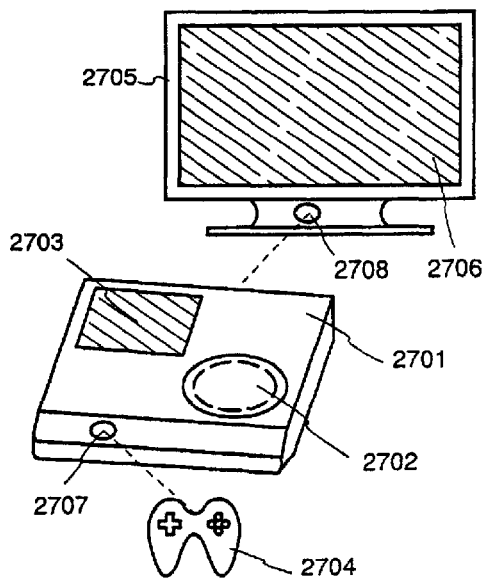

FIG. 25B is an electronic game machine which comprises: a main body 2701; a recording medium 2702; a display section 2703 and a controller 2704. The sound and image outputted from the electronic game machine is reproduced in the cover 2705 and a display which comprises the display section. A wire communication, a wireless communication or an optical communication may be used as a communication means between the controller 2704 and the main body 2701, or between the electronic game machine and the display. In the present embodiment it is structured to detect infrared ray in the sensor sections 2707 and 2708. The electro-optical device of the present invention can be used for the display sections 2703 and 2706.

Figure 25C:
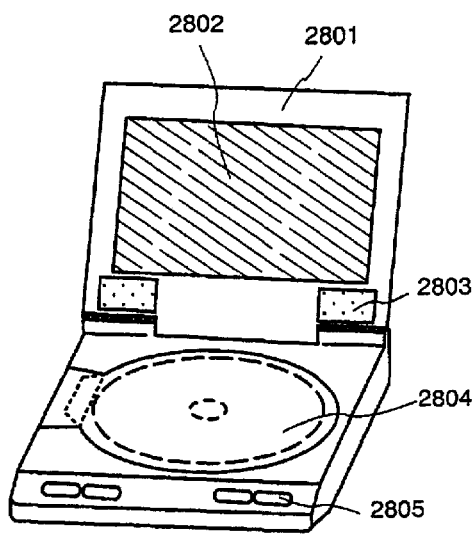

FIG. 25C is a player that uses a recording medium on which a program is recorded (hereinafter referred to as a recording medium), which comprises: a main body 2801; a display section 2802; a speaker section 2803; a recording medium 2804; and operation switches 2805 etc. Note that music appreciation, film appreciation, games, and the use of the Internet can be performed with this device using a DVD (digital versatile disk), a CD, etc., as a recording medium. The electro-optical device of the present invention can be used for the display sections 2802.

Figure 25D:
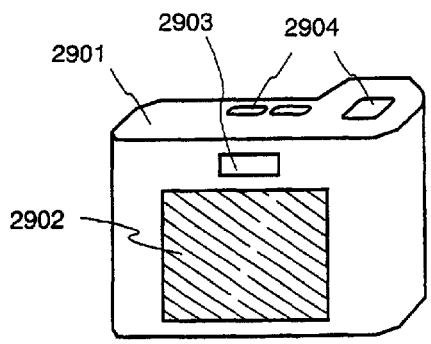

FIG. 25D is a digital camera which comprises: a main body 2901; a display section 2902; a view finder section 2903; operation switches 2904; and an image receiving section (not shown in the figure). The electro-optical device of the present invention can be used for the display section 2902.

Figure 26A:
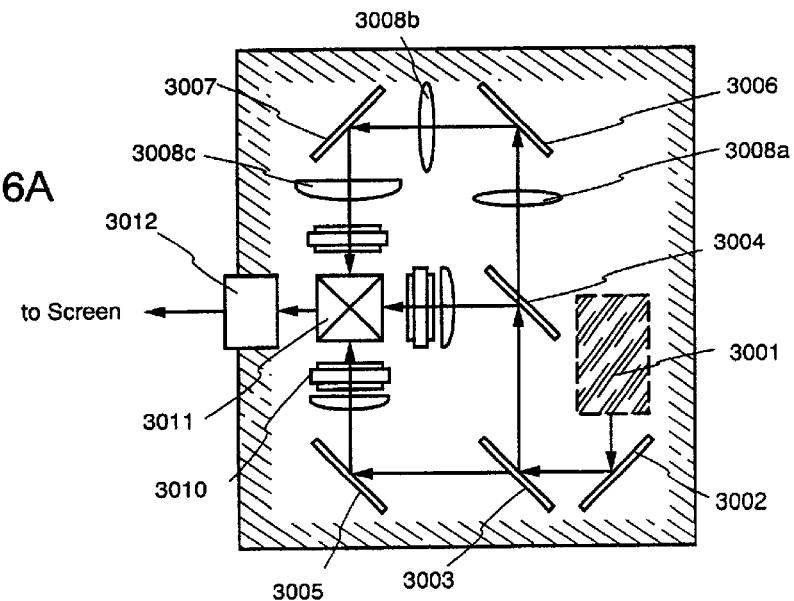
FIGS. 26A to 26B illustrate the structure of an optical engine.
Figure 26B:
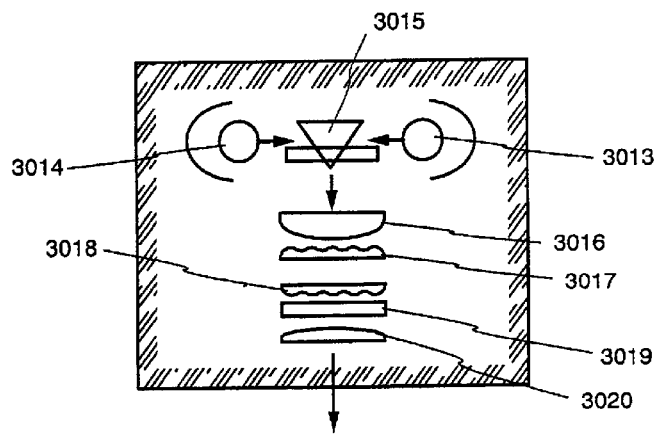

Detail description of the optical engine that can be used in the rear projector of FIG. 24E and the front projector of FIG. 24F is shown by FIGS. 26A and 26B. Note that FIG. 26A is an optical engine and FIG. 26B is an optical light source system incorporated into the optical engine.

The optical engine shown in FIG. 26A comprises an optical light source system 3001, mirror 3002 and 3005 to 3007, dichroic mirrors 3003 and 3004, optical lenses 3008a to 3008c, a prism 3011, a liquid crystal display device 3010, and a projection optical system 3012. The projection optical system 3012 is an optical system incorporating a projection lens. Though the present embodiment showed an example of 3-plate type which uses 3 liquid crystal display devices 3010, it may be a single plate type. An optical lens, a film having a polarizing function, a film for adjusting phase difference, or IR film, etc. may be provided in the optical path shown by an arrow in FIG. 26A.

As shown in FIG. 26B, an optical light source system 3001 comprises a light source 3013 and 3014, a composing prism 3015, a collimating lens 3016 and 3020, lens arrays 3017 and 3018, and polarizing inversion element 3019. Though the optical light source system shown in FIG. 26B uses 2 light sources, it may be 1, or 3 or more. An optical lens, a film having a polarizing function, a film for adjusting phase differences, or IR film, etc. may be provided in the optical path of the optical light source system.

As described above, the applicable range of the active matrix display device of the present invention is very large, and it is possible to apply to electronic devices of various areas. Further, the electric appliances of the present embodiment can be realized by combining constitutions of Embodiments 1 to 18 in accordance with necessity.

The present invention has the following advantages:
1) Pin holes in the dielectric of storage capacitors can be filled up; and
2) The flatness of alignment films (flatness of pixel electrodes) is improved. 1) can prevent short circuit between electrodes in storage capacitors, and 2) can prevent misorientation of liquid crystal.

Further, by using spacers made of an elastic resin material, load on the device can be decreased, thereby preventing from being lowered the yield and the reliability due to breakage of the device and the like. In this way, improvement of the operating performance and the reliability of electro-optical devices represented by a liquid crystal display device can be attained.

This follows that improvement can be attained of the operating performance and the reliability of electric apparatus having such an electro-optical device as a display.

What is claimed is:

1. A semiconductor device comprising:
   a thin film transistor formed over a substrate, said thin film transistor comprising at least a source region, a drain region, a channel forming region, and a gate electrode with a gate insulating film interposed therebetween;
   a pixel comprising a pixel electrode connected with said source or said drain region and comprising a storage capacitor; and
   a spacer,
   wherein said storage capacitor comprises a shielding film provided over said thin film transistor with an insulating film interposed therebetween, an insulating layer covering said shielding film, and said pixel electrode provided in contact with said insulating layer,
   wherein said insulating layer has a hole which is filled with an insulating material comprising a resin material, and
   wherein said insulating material and said spacer comprise a same material, and
   wherein said spacer is formed over daid insulating film.

2. A semiconductor device according to claim 1, wherein said shielding film comprises a material which contains mainly aluminum.

3. A semiconductor device according to claim 1, wherein said pixel electrode exists over said region which is filled with said insulating layer comprising said resin material.

4. A semiconductor device according to claim 1, wherein said spacer is formed in a region where a sealing member is formed, and wherein said sealing member is formed over a peripheral portion of said substrate.

5. A semiconductor device according to claim 1, wherein said spacer is formed in a region where a sealing member is formed and in a pixel portion, and wherein said sealing member is formed over a peripheral portion of said substrate.

6. A semiconductor device according to claim 1, wherein said spacer is formed in a region where a sealing member is formed and in a region between a driver circuit and a pixel portion, and wherein said sealing member is formed over a peripheral portion of said substrate.

7. A semiconductor device according to claim 1, wherein said spacer is formed in a region between a driver circuit and a pixel portion and in a pixel portion.

8. A semiconductor device according to claim 1, wherein said semiconductor device is a liquid crystal display device.

9. A semiconductor device according to claim 1, wherein said semiconductor device is one selected from the group consisting of a portable telephone, a video camera, a mobile computer, a goggle type display, a projector, a personal computer, an electronic game machine, and a digital camera.

10. A semiconductor device comprising:
    a thin film transistor formed over a substrate, said thin film transistor comprising at least a source region, a drain region, a channel forming region, and a gate electrode with a gate insulating film interposed therebetween; and
    a pixel comprising a pixel electrode connected with said source or said drain region and comprising a storage capacitor; and
    a spacer,
    wherein said storage capacitor comprises a shielding film provided over said thin film transistor with an insulating film interposed therebetween, an oxide of said shielding film covering said shielding film, and said pixel electrode provided in contact with said oxide,
    wherein said oxide has a region which is filled with an insulating material comprising a resin material, and
    wherein said insulating material and said spacer comprise a same material, and
    wherein said spacer is formed over said insulating film.

11. A semiconductor device according to claim 10, wherein said shielding film comprises a material which contains mainly aluminum.

12. A semiconductor device according to claim 10, wherein said pixel electrode exists over said region which is filled with said insulating material made of said resin material.

13. A semiconductor device according to claim 10, wherein said spacer is formed in a region where a sealing member is formed, and wherein said sealing member is formed over a peripheral portion of said substrate.

14. A semiconductor device according to claim 10, wherein said spacer is formed in a region where a sealing member is formed and in a pixel portion, and wherein said sealing member is formed over a peripheral portion of said substrate.

15. A semiconductor device according to claim 10, wherein said spacer is formed in a region where a sealing member is formed and in a region between a driver circuit and a pixel portion, and wherein said sealing member is formed over a peripheral portion of said substrate.

16. A semiconductor device according to claim 10, wherein said spacer is formed in a region between a driver circuit and a pixel portion and in a pixel portion.

17. A semiconductor device according to claim 10, wherein said semiconductor device is a liquid crystal display device.

18. A semiconductor device according to claim 10, wherein said semiconductor device is one selected from the group consisting of a portable telephone, a video camera, a mobile computer, a goggle type display, a projector, a personal computer, an electronic game machine, and a digital camera.

19. A semiconductor device comprising:
a thin film transistor formed on an insulator, said thin film transistor comprising at least a source region, a drain region, a channel forming region, and a gate electrode with a gate insulating film interposed therebetween;
a pixel comprising a pixel electrode connected with said source or said drain region and comprising a storage capacitor; and
a spacer,
wherein said storage capacitor comprises a shielding film provided over said thin film transistor with an insulating film interposed therebetween, an insulating layer covering said shielding film, and said pixel electrode provided in contact with said insulating layer,
wherein said insulating layer has a region which is filled with an insulating material comprising a resin material, and
wherein said spacer is formed over a contact portion where said thin film transistor and said pixel electrode are connected with each other.

20. A semiconductor device according to claim 19, wherein said shielding film comprises a material which contains mainly aluminum.

21. A semiconductor device according to claim 19, wherein said pixel electrode exists over said region which is filled with said insulating material made of said resin material.

22. A semiconductor device according to claim 19, wherein said semiconductor device is a liquid crystal display device.

23. A semiconductor device according to claim 19, wherein said semiconductor device is one selected from the group consisting of a portable telephone, a video camera, a mobile computer, a goggle type display, a projector, a personal computer, an electronic game machine, and a digital camera.

24. A semiconductor device comprising:
a thin film transistor formed on an insulator, said thin film transistor comprising at least a source region, a drain region, a channel forming region, and a gate electrode with a gate insulating film interposed therebetween;
a pixel comprising a pixel electrode connected with said source or said drain region and comprising a storage capacitor; and
a spacer,
wherein said storage capacitor comprises a shielding film provided over said thin film transistor with an insulating film interposed therebetween, an oxide of said shielding film covering said shielding film, and said pixel electrode provided in contact with said oxide,
wherein said oxide has a region which is filled with an insulating material comprising a resin material, and
wherein said spacer is formed over a contact portion where said thin film transistor and said pixel electrode are connected with each other.

25. A semiconductor device according to claim 24, wherein said shielding film comprises a material which contains mainly aluminum.

26. A semiconductor device according to claim 24, wherein said pixel electrode exists over said region which is filled with said insulating material made of said resin material.

27. A semiconductor device according to claim 24, wherein said semiconductor device is a liquid crystal display device.

28. A semiconductor device according to claim 24, wherein said semiconductor device is one selected from the group consisting of a portable telephone, a video camera, a mobile computer, a goggle type display, a projector, a personal computer, an electronic game machine, and a digital camera.

29. A semiconductor device comprising:
a pixel thin film transistor formed on an insulator, said pixel thin film transistor comprising a source region, a drain region, a channel forming region, and a gate electrode adjacent to said channel forming region with a gate insulating film interposed therebetween; and
a storage capacitor comprising a first conductive film, an insulating layer in contact with said first conductive film, and a second conductive film in contact with said insulating layer and electrically connected to said source or said drain region,
wherein said insulating layer has a hole filled with a material comprising a resin.

30. A semiconductor device according to claim 29, wherein said first conductive film comprises aluminum.

31. A semiconductor device according to claim 29, wherein said resin comprises polyimide or acrylic resin.

32. A semiconductor device according to claim 29, wherein said semiconductor device is a liquid crystal display device.

33. A semiconductor device according to claim 29, wherein said semiconductor device is one selected from the group consisting of a portable telephone, a video camera, a mobile computer, a goggle type display, a projector, a personal computer, an electronic game machine, and a digital camera.

34. A semiconductor device comprising:
a pixel thin film transistor formed on an insulator, said pixel thin film transistor comprising a source region, a drain region, a channel forming region, and a gate electrode adjacent to said channel forming region with a gate insulating film interposed therebetween; and
a storage capacitor comprising a first conductive film, an oxide of said first conductive film covering said first conductive film, and a second conductive film in contact with said oxide and electrically connected to said source or said drain region,
wherein said oxide has a region filled with a material comprising a resin.

35. A semiconductor device according to claim 34, wherein said first conductive film comprises aluminum.

36. A semiconductor device according to claim 34, wherein said resin comprises polyimide or acrylic resin.

37. A semiconductor device according to claim 34, wherein said semiconductor device is a liquid crystal display device.

38. A semiconductor device according to claim 34, wherein said semiconductor device is one selected from the group consisting of a portable telephone, a video camera, a mobile computer, a goggle type display, a projector, a personal computer, an electronic game machine, and a digital camera.

39. A semiconductor device comprising:
a thin film transistor over a first substrate;
a pixel electrode electrically connected to said thin film transistor in a contact hole;
a conductive layer adjacent to the pixel electrode with an insulating layer therebetween;
a spacer on said contact hole, said spacer having at least an upper surface, and a side surface; and
a second substrate opposed to said first substrate,
wherein said upper surface faces a surface of said second substrate, and
wherein the insulating layer has a hole which is filled with an insulating material comprising a resin material.

40. A semiconductor device according to claim 39, wherein said spacer comprises the resin material.

41. A semiconductor device according to claim 39, wherein said semiconductor device is a liquid crystal display device.

42. A semiconductor device according to claim 39, wherein said semiconductor device is one selected from the group consisting of a portable telephone, a video camera, a mobile computer, a goggle type display, a projector, a personal computer, an electronic game machine, and a digital camera.

43. A semiconductor device comprising:
a thin film transistor over a substrate;
a pixel electrode electrically connected to said thin film transistor in a contact hole; and
a spacer on said contact hole, wherein said contact hole is filled with said spacer.

44. A semiconductor device according to claim 43, wherein said spacer comprises a resin material.

45. A semiconductor device according to claim 43, wherein said semiconductor device is a liquid crystal display device.

46. A semiconductor device according to claim 43, wherein said semiconductor device is one selected from the group consisting of a portable telephone, a video camera, a mobile computer, a goggle type display, a projector, a personal computer, an electronic game machine, and a digital camera.

* * * * *